United States Patent
Vice et al.

(10) Patent No.: US 9,088,257 B2
(45) Date of Patent: Jul. 21, 2015

(54) DEVICE AND METHOD FOR CONTROLLING POWER AMPLIFIER

(71) Applicant: Avago Technologies General IP (Singapore) Pte. Ltd., Singapore (SG)

(72) Inventors: Michael Wendell Vice, El Granada, CA (US); Sungkil Hwang, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 93 days.

(21) Appl. No.: 13/834,953

(22) Filed: Mar. 15, 2013

(65) Prior Publication Data
US 2014/0266456 A1    Sep. 18, 2014

(51) Int. Cl.
*H03G 3/20* (2006.01)
*H03G 1/00* (2006.01)

(52) U.S. Cl.
CPC .............. *H03G 1/0017* (2013.01); *H03G 3/20* (2013.01)

(58) Field of Classification Search
CPC ..................................................... H03F 1/0233
USPC .................................. 330/127, 296, 297, 285
See application file for complete search history.

(56) References Cited

U.S. PATENT DOCUMENTS

| 7,706,467 | B2 | 4/2010 | Kenington |
| 7,728,663 | B2 * | 6/2010 | Rabjohn et al. ............ 330/124 R |
| 8,174,313 | B2 | 5/2012 | Vice |
| 8,233,858 | B2 | 7/2012 | Sorrells et al. |

OTHER PUBLICATIONS

Gabriel Montoro et al., "Slew-Rate Limited Envelopes for Driving Envelope Tracking Amplifiers", 2011 IEEE Radio and Wireless Symposium, Phoenix, AZ, USA, Jan. 2011, pp. 1-4.
Gabriel Montoro et al., "Digital Predistortion of Envelope Tracking Amplifiers Driven by Slew-rate Limited Envelopes", 2011 IEEE MTT-S International Microwave Symposium, Baltimore, MD, USA, 2011, pp. 1-4.
John Hoversten et al., "Envelope Tracking Transmitter System Analysis Method", 2010 IEEE Radio and Wireless Symposium (RWS), Publication date: Jan. 10-14, 2010, pp. 180-183.

* cited by examiner

*Primary Examiner* — Robert Pascal
*Assistant Examiner* — Khiem Nguyen

(57) ABSTRACT

A device for controlling operation of a power amplifier includes a detector, a reference signal generator and a controller. The detector is configured to detect a voltage level of an output signal of the power amplifier with respect to a predetermined boost threshold and to generate a corresponding detection signal and a reference signal. The controller is configured to provide a supply voltage to an output transistor of the power amplifier based on a comparison of the detection signal and the reference signal, the supply voltage being a no boost voltage, which is substantially the same as a supply voltage, when the comparison indicates that the voltage level is within the predetermined boost threshold, and the supply voltage being one of multiple boost voltages when the detection signal indicates that the voltage level is beyond the predetermined boost threshold. The controller generates the boost voltages by boosting the supply voltage.

17 Claims, 22 Drawing Sheets

DEVICE AND METHOD FOR CONTROLLING POWER AMPLIFIER

BACKGROUND

Wireless communications systems are designed around various modulation schemes, such as orthogonal frequency-division multiplexing (OFDM) and code division multiple access (CDMA), intended to provide efficient utilization of the allocated spectrum. Spectrally efficient modulation schemes have high crest factors (e.g., peak to average power ratios). However, proper conveyance of data and acceptable spectral re-growth characteristics place a linearity burden on the transmit chain, including a power amplifier.

In order to achieve the required linearity, conventional systems typically require substantial power back-off from saturation of an output transistor in the power amplifier, which significantly reduces efficiency. In portable equipment, such as cellular telephones, reduction in efficiency translates into shorter battery life and reduced operating time between battery recharges. Generally, the industry trend is to increase the interval between battery recharges and/or to decrease the size of the batteries. Therefore, the efficiency of power amplifiers should be increased while still meeting linearity requirements.

Attempts have been made to improve linearity focusing on providing two levels of drain (or collector) supply voltages. For example, U.S. Pat. No. 8,174,313 to Vice, issued May 8, 2012, which is hereby incorporated by reference, discloses controlling a power amplifier using a detector, configured to detect the power level of a radio frequency (RF) input signal with respect to a predetermined power threshold and a controller configured to provide a supply voltage to the power amplifier in response to a detection signal from the detector. The supply voltage has either a low voltage value when the detection signal indicates that the power level is below the power threshold, or a high (boosted) voltage value when the detection signal indicates that the power level is above the power threshold. However, greater efficiency and simpler design are desirable.

SUMMARY

In a representative embodiment, a device for controlling operation of a power amplifier configured to amplify an input signal includes a detector and a controller. The detector is configured to detect a voltage level of an output signal of the power amplifier with respect to a predetermined boost threshold and to generate a corresponding detection signal and a reference signal. The controller is configured to provide a supply voltage to an output transistor of the power amplifier based on a comparison of the detection signal and the reference signal, the supply voltage being a no boost voltage, which is substantially the same as a supply voltage, when the comparison indicates that the voltage level is within the predetermined boost threshold. The supply voltage is one of a plurality of boost voltages when the detection signal indicates that the voltage level is beyond the predetermined boost threshold. The controller generates the plurality of boost voltages by boosting the supply voltage.

In another representative embodiment, a method is provided for selectively boosting a collector supply voltage of an output transistor in a power amplifier amplifying a radio frequency (RF) signal. The method includes providing a supply voltage as the collector supply voltage of the output transistor by connecting a supply voltage source to the output transistor, and selectively connecting a plurality of charge storage capacitors to receive charge from the supply voltage source to charge each of the plurality of charge storage capacitors to a capacitor voltage value; evaluating a magnitude of an envelope of the RF signal and detecting when a lowest occurring voltage extreme of the envelope becomes less than a predetermined boost threshold; providing a first boosted voltage as the collector supply voltage when the lowest occurring voltage extreme of the envelope becomes less than the predetermined boost threshold by connecting one of the plurality of charge storage capacitors between the supply voltage source and the output transistor, the first boosted voltage including the supply voltage plus the capacitor voltage value previously stored in one of the plurality of charge storage capacitors; and providing a second boosted voltage as the collector supply voltage when the lowest occurring voltage extreme of the envelope again becomes less than the predetermined boost threshold by simultaneously connecting two of the plurality of charge storage capacitors between the supply voltage source and the output transistor, the second boosted voltage including the capacitor voltage values previously stored in both of the two charge storage capacitors.

In another representative embodiment, a device for controlling operation of a power amplifier configured to amplify an RF signal includes a detector, a DC controller and a compensation circuit. The detector is configured to generate a detection signal and a reference signal based on a negative peak voltage level of an output signal of the power amplifier. The DC controller is configured to provide a DC supply voltage and compensation signals to an output transistor of the power amplifier based on comparison of the detection signal and the reference signal, the DC supply voltage being a no boost voltage when the negative peak voltage level is above a predetermined boost threshold, and one of a medium boost voltage and a high boost voltage when the negative peak voltage level is below the predetermined boost threshold. The compensation circuit includes a plurality of series RC circuits connected in series with a corresponding plurality of switches for selectively connecting one or more of the plurality of series RC circuits, respectively, around the transistor in a shunt-shunt feedback configuration in response to the plurality of compensation signals.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
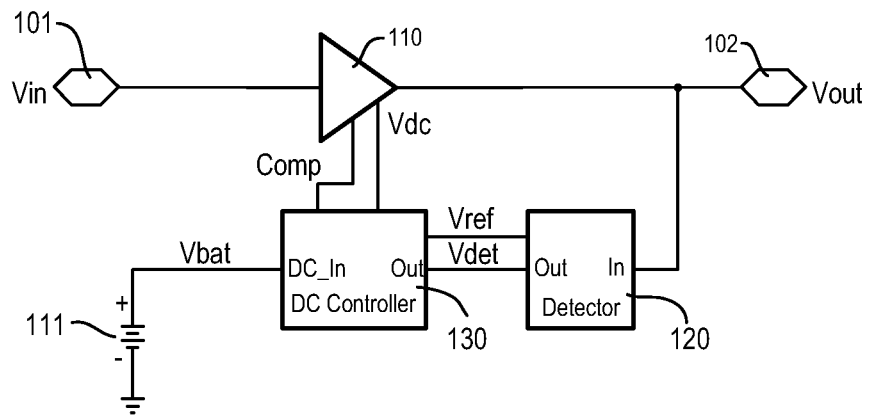
FIG. 1 is a block diagram illustrating an amplifier control circuit, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

An envelope tracking technique may be used to improve amplifier efficiency. Generally, a collector supply voltage provided to the output transistor of a power amplifier (or drain supply voltage, depending on the type of output transistor incorporated in the power amplifier) is modulated to provide the output transistor the voltage required by the carrier envelope at each point in time, but no more. In comparison, whereas a traditional power amplifier may provide 3.3V to the collector of the output transistor at all times, the envelope tracking technique according to various embodiments provides real time optimization of the collector supply voltage using at least three predetermined voltages, so that the collector supply voltage is sufficient, but not excessive, at all times. The envelope tracking technique therefore enhances efficiency, particularly at times when the carrier envelope is below maximum.

Conventional envelope tracking techniques involve a linear tracking voltage supply, which is modulated by an envelope detector. Such a system is cumbersome, however, because it includes a continuously variable DC-to-DC converter, which typically requires a large high-Q inductor.

According to various embodiments, an envelope tracking technique is provided that requires no continuously variable DC-to-DC converter. Rather, the collector supply voltage (or drain supply voltage) provided to the output transistor of the power amplifier is adjusted to be one of at least three values, depending on the envelope of the carrier of an RF input signal Vin, to ensure that the output transistor has sufficient collector supply voltage required by the carrier envelope. For example, the three collector supply voltages may be one of a no boost voltage Vnb (supply voltage, e.g., provided by a battery), medium boost voltage Vmb that is about one and a half times the no boost voltage, and high boost voltage Vhb that is about twice the no boost voltage. Alternative embodiments contemplate more than three collector supply voltages (more than two boost voltage steps, or alternatively, a combination of boost steps and fractionated voltage steps, that is, voltage steps below the battery voltage). Selective application of the boosted voltages to the collector of the output transistor enables the output transistor to continue to operate properly when maximum power output is required.

FIG. 1 is a block diagram illustrating an amplifier control circuit, according to a representative embodiment.

Referring to FIG. 1, amplifier circuit 100 includes power amplifier 110, detector 120, and DC controller 130. The power amplifier 110 is configured to amplify an RF input signal Vin received by the amplifier circuit 100 through signal input port 101, and to output an amplified RF output signal Vout from signal output port 102. The detector 120 may be a negative peak detector, for example, for detecting negative peaks of the RF output signal Vout. The DC controller 130 is configured to provide DC supply voltage Vdc having one of multiple voltage values (e.g., three voltage values), as discussed below, and one or more compensating voltages (e.g., first and second compensation signals Comp1, Comp2).

Figure 2:
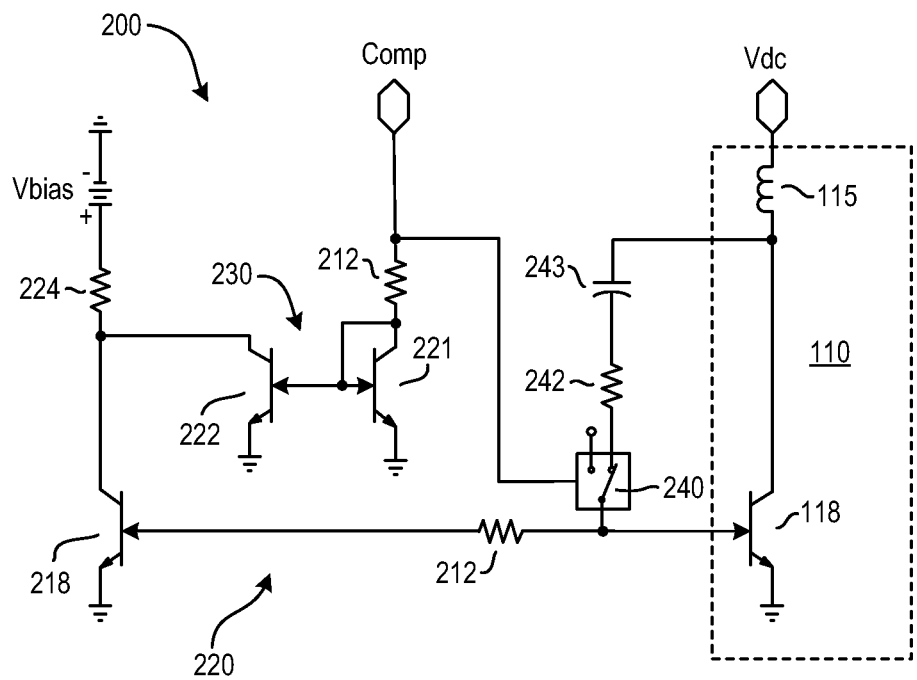
FIG. 2 is a circuit diagram illustrating an output transistor compensation control circuit for correcting quiescent bias increase in the power amplifier shown in FIG. 1, according to a representative embodiment.

FIG. 2 is a circuit diagram illustrating an output transistor compensation control circuit for correcting quiescent bias increase in the amplifier shown in FIG. 1, according to a representative embodiment.

Referring to FIG. 2, the power amplifier 110 includes an inductor 115 and an output transistor 118, which may be an NPN doped bipolar junction transistor (BJT), for example. The collector of the output transistor 118 is connected to the DC supply voltage Vdc through the inductor 115. The collector of the output transistor 118 may be connected to the DC supply voltage Vdc through a transmission line, or through other means of bias connection typical to the art. Other types of transistors within the purview of one of ordinary skill in the art may be incorporated into the power amplifier 110, without departing from the scope of the present teachings. For example, the output transistor 118 may be a field effect transistor (FET), such as a gallium arsenide FET (GaAs FET), a metal-oxide semiconductor FET (MOSFET) or a heterostructure FET (HFET), a high electron mobility transistor (HEMT), a pseudomorphic HEMT (pHEMT), or the like. In the depicted embodiment, the output transistor 118 includes a base connected to the signal input port 101 (not shown) for receiving the RF input signal Vin, a collector connected to a supply output of the DC controller 130 for receiving a DC supply voltage Vdc via the first inductor 115, and an emitter connected to ground. Another inductor (not shown) may be connected in series between the collector of the output transistor 118 and the signal output port 102 for outputting the output signal Vout of the amplifier circuit 100. Also, another capacitor (not shown) may be connected between the signal output port 102 and ground. The additional inductor and capacitor form a representative output impedance matching network that is typical to the art.

For purposes of discussion, terms typically corresponding to BJTs, such as emitter, collector and base, are used herein to describe the output transistor 118 of the power amplifier 110. However, it is understood that these terms are not intended to be limiting, and that terms corresponding to FETs, such as drain, source and gate, would be applicable for other types of transistors in various alternative configurations.

Rather than using a complex attenuator somewhere in the gain chain to compensate for changes in $S_{21}$ magnitude and phase when the DC supply voltage Vdc is increased, a feedback network is placed around the output transistor 118. The feedback network generally includes a series RC circuit comprising a resistor and a capacitor (e.g., resistor 242 and capacitor 243) connected in series with a switch (e.g., compensation feedback switch 240), the state of which is controlled by the DC controller 130 via first compensation signal Comp1. There are n−1 such feedback networks for an amplifier circuit 100 having a DC controller 130 that produces n different output voltages. Superior neutralization of the transfer function of the output transistor 118 shifts with respect to the DC supply voltage Vdc has been observed with this type of compensation.

More particularly, the compensation control circuit 200 in FIG. 2 provides a combination of feedback compensation and quiescent bias compensation, which corrects the quiescent bias increase with increased collector (drain) supply voltage of the output transistor 118. The compensation control circuit 200 includes a first current mirror 220 and second current mirror 230 driven by control logic that also controls compensation feedback switches, indicated by representative compensation feedback switch 240. The first current mirror 220 is formed by the output transistor 118 and mirror transistor 218, having bases connected through resistor 212. The mirror transistor 218 thus forms a simple current mirror representation of the bias circuit for the output transistor 118. The base of the output transistor 118 is also connected to the compensation feedback switch 240.

The second current mirror 230 is formed by the mirror transistors 221 and 222, having bases connected to one another. The collector of the mirror transistor 222 is connected to voltage source Vbias through resistor 224. The collector of the mirror transistor 221 is connected to the common base of transistors 221 and 222. The collector is also connected to the compensation voltage Comp through resistor 212, also received from the DC controller 130. Comp is also connected to a control input of the compensation feedback switch 240. A second input of the compensation feedback switch 240 is connected to the base of the output transistor 118 through resistor 242 and capacitor 243. Accordingly, the compensation feedback switch 240 is able to selectively connect or disconnect the base of the output transistor 118 to resistor 242.

Figure 23:
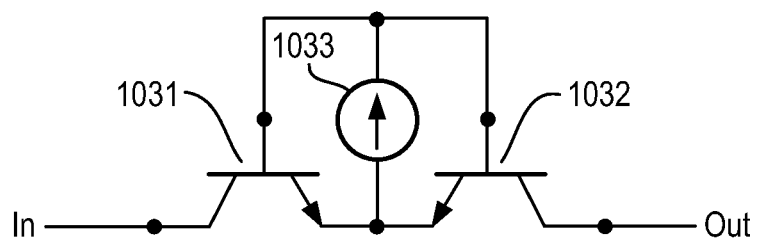
FIG. 23 is a circuit diagram illustrating a compensation feedback switch of the output transistor compensation control circuit, according to a representative embodiment.

In an embodiment, the compensation feedback switch 240 (and any other compensation feedback switches in the compensation control circuit 200) may be implemented using BJTs. FIG. 23 is a circuit diagram illustrating a BJT compensation feedback switch of the output transistor compensation control circuit, according to a representative embodiment.

Referring to FIG. 23, the compensation feedback switch 240 includes a first compensation switching transistor 1031, a second compensation switching transistor 1032, and a compensation current source 1033. The first compensation transistor 1031 includes a base connected to the compensation switch current source 1033, a collector connected to the signal input port 101 of the amplifier circuit 100, for example, and an emitter connected to the compensation switch current source 1033 and the emitter of the second compensation transistor 1032. In various alternative configurations, the compensation feedback switch 240 need not be connected to the signal input port 101. For example, the compensation feedback switch 240 may be connected between the RC circuit and the collector of the output transistor 118, and the other end of the RC circuit may have a permanent connection to the base of the output transistor 118. Additionally, the base of the output transistor 1188 may not be necessarily be directly connected to the signal input port 101, as there may be an intervening matching network. The second compensation transistor 1032 includes a base connected to the compensation switch current source 1033, a collector connected to the collector of the output transistor 118 (e.g., via resistor 242 and capacitor 243), and an emitter connected to a common node with the compensation switch current source 1033 and the emitter of the first compensation transistor 1031. The compensation switch current source 1033 may be realized as a first resistor connected from the common base of the first and second compensation transistors 1031 and 1032 to the compensation control voltage Comp, and a second resistor connected from the common emitter of the first and second compensation transistors 1031 and 1032 and ground, for example.

Figure 4:
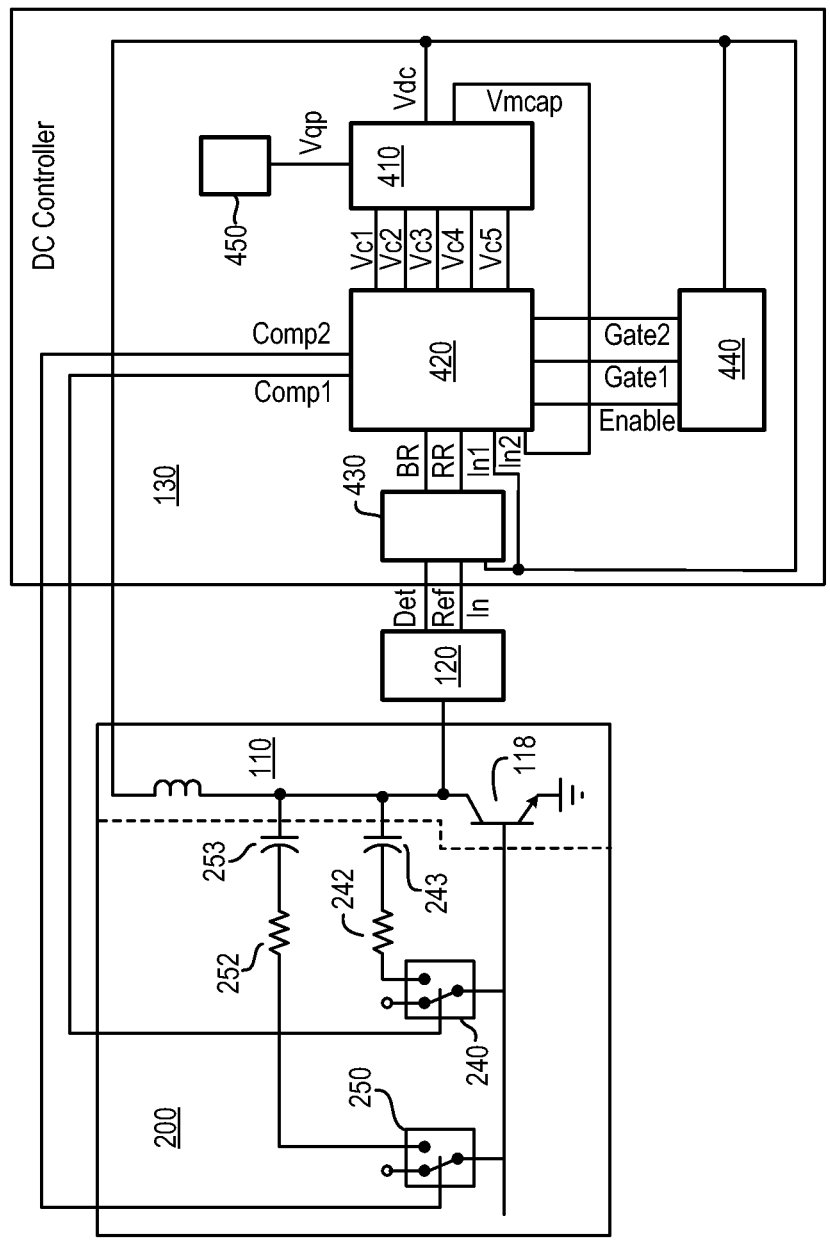
FIG. 4 is a block diagram illustrating a DC controller of the amplifier circuit, according to a representative embodiment.

As noted above, although the illustrative configuration is shown of the compensation feedback switch 240, the example also applies to other compensation feedback switches, such as compensation feedback switch 250 in FIG. 4. Of course, in alternative embodiments, the compensation feedback switch 204 (and any other compensation feedback switches in the compensation control circuit 200) may be implemented using FETs, as would be apparent to one of ordinary skill in the art.

As mentioned above, although not shown in FIG. 2, the number of compensation feedback switches and corresponding RC circuits, such as compensation feedback switch 240, the resistor 242 and the capacitor 243, is equal to one less than the number of values of the DC supply voltage Vdc output by the DC controller 130 (e.g., n=3 for three supply voltage values). However, for ease of explanation, the DC controller 130 in the present example is assumed to produce only two voltages (e.g., n=2 for two values of the DC supply voltage Vdc−Vdd and 2Vdd), so there is only one feedback network including the compensation feedback switch 240, the resistor 242 and the capacitor 243. The compensation feedback switch 240 is controlled by the compensation voltage Comp, which comes from the DC controller 130 and is configured so that the compensation feedback switch 240 closes in the high voltage state. For instance, when the value of DC supply voltage Vdc is equal to 2Vdd, the compensation voltage Comp is equal to Vdd and the compensation feedback switch 240 is closed. The second current mirror 230 forms the bias compensation network. When the compensation voltage Comp is high, the bias compensation network steals current from the resistor 224, which reduces the drain current in the output transistor 118 sufficiently to match the quiescent current with that of the low drain supply voltage state. For larger values of n, the feedback and bias networks are multiplied n−1 times, wherein each network has a different and optimal value for R and C. In some cases one or more resistor values may be 0 ohms. The networks are turned on successively and cumulatively with increasing DC supply voltages Vdc, with the result that the quiescent current and s-parameters of the output transistor 118 remain stationary with respect to the value (state) of the DC supply voltage Vdc.

Together with compensation control signal Comp from the DC controller 130 (discussed below), the compensation control circuit 200 provides more precise compensation (e.g., particularly when a FET is used as the amplifying output transistor 118) than would be obtained if feedback compensation alone were used. Generally, compensation refers to techniques used to maintain transfer characteristics of the output transistor 118 as the DC supply voltage is switched between the various values provided by the DC controller 130.

Figure 3:
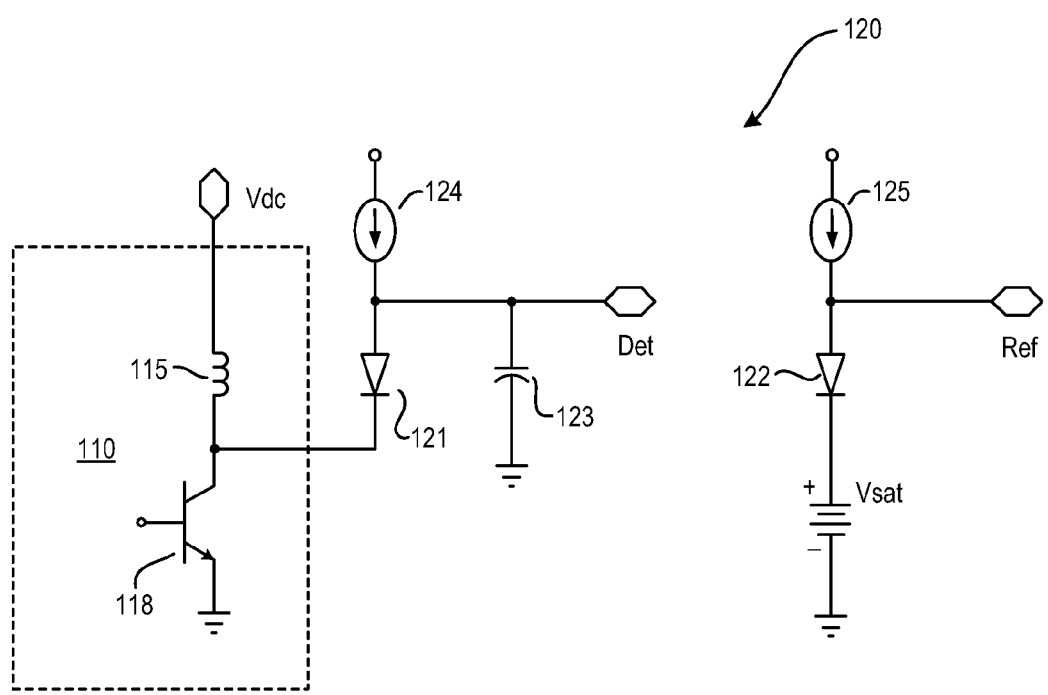
FIG. 3 is a block diagram illustrating a detector of the amplifier control circuit shown in FIG. 1, according to a representative embodiment.

FIG. 3 is a block diagram illustrating a detector of the amplifier control circuit shown in FIG. 1, according to a representative embodiment. More particularly, FIG. 3 depicts the amplifier 110 and the detector 120, according to a representative embodiment.

Generally, the detector 120 is a temperature compensated envelope negative peak detector. Means of temperature compensating the detector 120 has been developed in keeping with the inherent sensitivity of the amplifier circuit 100 to detector error. The means involves the use of a replica diode and a special bias circuit that ensures equal bias on each diode. The replica diode is connected to a voltage source that is substantially equal to the critical collector (drain) voltage of the output transistor 118, referred to as saturation voltage (Vsat), at which the DC controller 130 is expected to switch to the next higher value of the DC supply voltage Vdc. Thus, there is a convenient way to set the aggressiveness of the amplifier circuit 100 in terms of efficiency-linearity tradeoff by setting the value of Vsat.

Referring to FIG. 3, the amplifier 110 includes the output transistor 118 and the inductor 115, as discussed above. In the depicted illustrative configuration, the detector 120 includes detector diode 121, replica diode 122 and capacitor 123. The detector diode 121 and the capacitor 123 form a negative peak detector. The detector diode 121 is biased by current source 124, and the replica diode 122 is biased by a matching current source 125 so that the detector diode 121 and the replica diode 122 track voltage drop over temperature and process variations. In a representative embodiment, the diodes 121 and 122 have the same areas, whence the current density in the diodes 121 and 122 is the same. Other configurations of area and bias current that result in the two diodes 121 and 122 having the same current density are the present teaching. Detection signal Det is output at the anode of the detector diode 121 and reference signal Ref is output at the anode of the replica diode 122. The voltage of the reference signal Ref serves to inform the DC controller 130 what the critical voltage is for the detection signal Det, at which point the output transistor 118 is deemed to be out of voltage and in need of a voltage boost. In other words, the reference signal Ref is the same as the detection signal Det that the detector 120 would produce when the negative peaks of the collector voltage of the output transistor 118 reach the saturation voltage Vsat. The detection signal Det and the reference signal Ref are input to a detector encoder 430 of the DC controller 130, discussed below with reference to FIG. 4.

For purposes of illustration, the functionality of the detector 120 is implemented using diodes: the detector diode 121 and the replica diode 122. It should be apparent, however, that the detector diode 121 and the replica diode 122 could be replace by transistors, respectively, functioning as diodes and therefore could be replaced with such transistors without change of functionality.

The detection signal Det represents an analog sample and hold process. It is the negative peak of the RF excursions of the collector of the output transistor 118, plus a forward voltage drop of the (diode wired) detector diode 121. The current source 124 provides a forward bias to the detector diode 121. In an embodiment, the sizes of the detector diode 121 and the replica diode 122 are the same, and the currents from detector current source 124 and the reference current source 125 are the same. Then the forward voltage drop of the detector diode 121 and the replica diode 122 at saturation of the power amplifier 110 are identical, regardless of process and temperature variation. When the voltage value of the detection signal Det descends down and intercepts the voltage value of reference signal Ref, the DC controller 130 instigates a boost operation, which supplies the output transistor 118 with more operating voltage, as discussed below.

Increased operating voltage will shift the collector voltage waveform of the output transistor 118 up in voltage, hence the detection signal Det output by the (negative peak) detector 120 will rise. If the envelope of the RF output signal Vout drops in magnitude, the detection signal Det output by the detector 120 will rise further. When the envelope of the RF output signal Vout drops to a point where a recovery event could be deployed without resulting in compression of the output transistor 118, the detection signal Det output by the detector 120 has risen to cross a predetermined threshold at which a recovery event is triggered. A boost event is defined herein as a state change from a lower DC supply voltage to a sequentially adjacent higher DC supply voltage output by the DC controller 130. A recovery event is defined herein as a state change from a higher DC supply voltage to a sequentially adjacent lower DC supply voltage output by the DC controller 130.

FIG. 4 is a block diagram illustrating the DC controller 130 of the amplifier circuit 100, according to a representative embodiment, as connected to the detector 120, the power amplifier 110, and (a portion of) the compensation control circuit 200. Generally, the DC controller 130 provides the DC supply voltage Vdc as the collector supply voltage for the output transistor 118 of the power amplifier 110. The DC controller 130 also provides first and second compensating signals Comp1 and Comp2 corresponding to the medium boost voltage Vmb and the high boost voltage Vhb, respectively, to the compensation control circuit 200. In the depicted example, the compensation control circuit 200 includes another feedback network that includes resistor 252, capacitor 253, and compensation feedback switch 250, the state of which is controlled by the DC controller 130 via a second compensation signal Comp2, discussed below.

Notably, the various circuits described herein may include a number of several inverters, which are not depicted for the sake of clarity. The inverters are used for the purpose of achieving desired switching speeds. As would be apparent to one of ordinary skill in the art, even numbers of inverters in cascade make no logical contribution to circuit operation, and the size and number of the inverters varies based on required speeds and currents from the DC controller 130, for example.

The collector supply voltage of the output transistor 118 is switched among three or more voltage values depending on the envelope of the RF input signal Vin received at the signal input port 101 (not shown) and the envelope of the respective RF output signal Vout. For purposes of explanation, an illustrative embodiment is described in which the collector supply voltage is switched among three voltage values. The first (smallest) voltage value is the boost voltage Vnb, which is effectively the supply voltage (Vdd) with no voltage boost. The second (intermediate) voltage value and the third (largest) voltage value provide incrementally increasing boost voltage steps, obtained by boosting the supply voltage by different amounts. For example, the second voltage value is the medium boost voltage Vmb which may be approximately one and a half times the supply voltage (1.5Vdd or 1.5Vnb), and the third voltage value is the high boost voltage Vhb which may be approximately twice the supply voltage (2Vdd or 2Vnb).

For purposes of discussion, it is assumed that the amplifier circuit 100 is included in a portable electronic device that is powered by a battery, and thus the supply voltage Vdd may be referred to as battery voltage Vbat. In this case, the no boost voltage Vnb may be the battery voltage Vbat (e.g., about 3.3V), which is equal to the battery voltage Vbat provided by battery 111. The medium boost voltage Vmb may be 1.5Vbat (e.g., about 4.95V), and the high boost voltage Vhb may be 2Vbat (e.g., about 6.6V). Stated differently, the medium boost voltage Vmb is equal to the no boost voltage Vnb (e.g., about 3.3V) plus a first voltage boost Vb1 (e.g., about 1.65V), and the high boost voltage Vhb is equal to the no boost voltage Vnb (e.g., about 3.3V) plus a second voltage boost Vb2 (e.g., about 3.3V). Accordingly, the collector supply voltage supports the maximum required power output only when that output is specifically demanded. Otherwise, the collector supply voltage is the medium boost voltage Vmb or the battery voltage Vbat, again depending on the instantaneous power level demanded, thus saving battery power of the battery 111 as aggressively as possible at each point in time.

When no RF power is presented to the power amplifier 110, the DC controller 130 provides the no boost voltage Vnb as the DC supply voltage Vdc, and thus the collector supply voltage of the output transistor 118 is the same as the battery voltage Vbat. As the RF power level increases, the collector supply voltage swings in both positive and negative excursions in an operational envelope about the DC level. According to various embodiments, the envelope magnitude is effectively evaluated by the detector 120 in terms of the lowest occurring voltage extreme (negative peak voltage level or most negative RF excursion) at the collector of the output transistor 118. The larger the RF power level, the lower the lowest occurring voltage extreme will be.

When the lowest occurring voltage extreme stays above a predetermined boost threshold (is within the predetermined boost threshold), the supply voltage Vdc is unchanged. When the lowest occurring voltage extreme falls below a predetermined boost threshold (is beyond the predetermined boost threshold), as indicated by the detector 120, the DC controller 130 switches to provide the medium boost voltage Vmb as the supply voltage Vdc, which is roughly 1.5 times the previously available no boost voltage Vnb to the collector, as discussed above. Similarly, when the lowest occurring voltage extreme again falls below the predetermined boost threshold, as indicated by the detector 120, the DC controller 130 switches to provide the high boost voltage Vhb as the supply voltage Vdc, which is roughly twice the no boost voltage Vnb to the collector, as discussed above. The predetermined boost threshold may correspond to onset of the triode region of operation for the output transistor 118, at which point the power amplifier 110 no longer operates properly (e.g., in saturation) and begins to compress severely. The voltage below which the power amplifier 110 no longer has good amplifier characteristics may be referred to as the saturation voltage Vsat.

After switching to the medium boost voltage Vmb, the DC controller 130 maintains the medium boost voltage Vmb until the demand on the power amplifier 110 is no longer sufficiently high, at which point the DC controller 130 switches back to the lower value no boost voltage Vnb, or until the demand progresses again to saturation, at which point the DC controller 130 switches to the high boost voltage Vhb. For example, when the lowest occurring voltage extreme exceeds a predetermined recovery threshold (is beyond the predetermined recovery threshold), as indicated by the detector 120, the DC controller 130 switches to again provide the no boost voltage Vnb as the supply voltage Vdc. After switching to the high boost voltage Vhb, the DC controller 130 maintains the high boost voltage Vhb until the demand on the power amplifier 110 is no longer high. At this point, the DC controller 130 switches back to the lower value medium boost voltage Vmb or the no boost voltage Vnb, depending on the extent of the demand and the relationship between the lowest occurring voltage extreme and the predetermined recovery threshold. Switching from the no boost voltage Vnb to the medium boost voltage Vmb, and switching from the medium boost voltage Vmb to the high boost voltage Vhb, may be referred to as boost events. Switching from the high boost voltage Vhb to the medium boost voltage Vmb, and switching from the medium boost voltage Vmb to the no boost voltage Vnb, may be referred to as recovery events.

In order to avoid unwanted distortion, complex gain of the power amplifier 110 may be compensated when the collector supply voltage is increased to the medium boost voltage Vmb or the high boost voltage Vhb. For example, it is possible for performance parameters of the output transistor 118 of the power amplifier 110 to change in response to changes in supply voltage enforced by the DC controller 130. This can give rise to unwanted non-linear artifacts that degrade modulation integrity and adjacent channel leakage performance. The complex gain compensation may be performed by the compensation control circuit 200.

Referring to FIG. 4, the DC controller 130 includes power switch 410, switch sequencer 420 and detector encoder 430. Generally, the detector encoder 430 receives the analog detection signal Det and the analog reference signal Ref output from the detector 120, which indicate when the output signal Vout of the output transistor 118 of the power amplifier 110 has reached the predetermined boost threshold (e.g., saturation). The detector encoder 430 translates the detection signal Det and the reference signal Ref into a two bit word, where the first bit provides a Boost Request signal and the second bit provides a Recovery Request signal. The switch sequencer 420 receives the Boost Request signal and the Recovery Request signal, enabling it to translate the detection signal Det and the reference signal Ref into a five bit word, including first through fifth control bits Vc1 to Vc5. The first through fifth control bits Vc1 to Vc5 are provided to the power switch 410. In response, the power switch 410 coordinates switching among the no boost voltage Vnb (e.g., supply voltage Vdd), the medium boost voltage Vmb and the high boost voltages Vhb, and outputs the selected voltage as the DC supply voltage Vdc to the power amplifier 110. That is, the power switch 410 operates under control of the first through fifth control bits Vc1 to Vc5 to pass through the supply voltage Vdd (in a pass-through state) or to boost on demand the battery voltage Vbat to one of the medium boost voltage Vmb or the high boost voltage Vhb, as discussed below.

Thus, when the output of the detector 120 falls to the critical voltage at which the collector supply for the power amplifier 110 must be boosted to the medium boost voltage Vmb (1.5Vbat), the detector encoder 430 generates a Boost Request signal (indicated by a rise of the Boost Request bit from a 0 to a 1) for the switch sequencer 420. Once the DC controller 130 has complied with the boost request the Boost Request bit of the detector encoder 430 returns to 0. After this operation, if the output of the detector 120 falls to the critical voltage again at which the collector supply for the power amplifier 110 must be boosted to the high boost voltage Vhb (2Vbat), the detector encoder 430 generates a boost request again. However, if the output of the detector 120 rises to the critical voltage at which the collector supply for the power amplifier 110 does not need the medium boost voltage Vmb or the high boost voltage Vhb anymore, then the detector encoder 430 generates a Recovery Request signal (indicated by a rise of the Recovery Request bit from a 0 to a 1) for the switch sequencer 420. Once the DC controller 130 has complied with the recovery request, the Recovery Request bit of the detector encoder 430 returns to 0.

In an embodiment, the DC supply voltage Vdc is also fed back to the detector encoder 430 as a bias voltage. Generally, when a recovery event is indicated by the appropriate conditions of relaxed carrier envelope magnitude, the output voltage of the detector 120 is relatively high. In order to maintain proper bias current through the detector diode 121, the corresponding current source 124 (FIG. 3) must have sufficient voltage compliance to maintain this current at the higher output voltage of the detector 120. To achieve this end, the current source 124 must be powered by a higher voltage than the battery voltage Vbat, hence it is convenient to power the current source 124 circuit with the DC supply voltage Vdc of the DC controller 130. For example, the output voltage of the detector 120 is high only when there is currently a boosted state, at which times the DC supply voltage Vdc is sufficiently high to keep the current source 124 circuit properly biased. In order to maintain absolute symmetry between the detector diode 121 and the replica diode 122, the DC supply voltage Vdc is also used to bias the reference current source 125.

Figure 8:
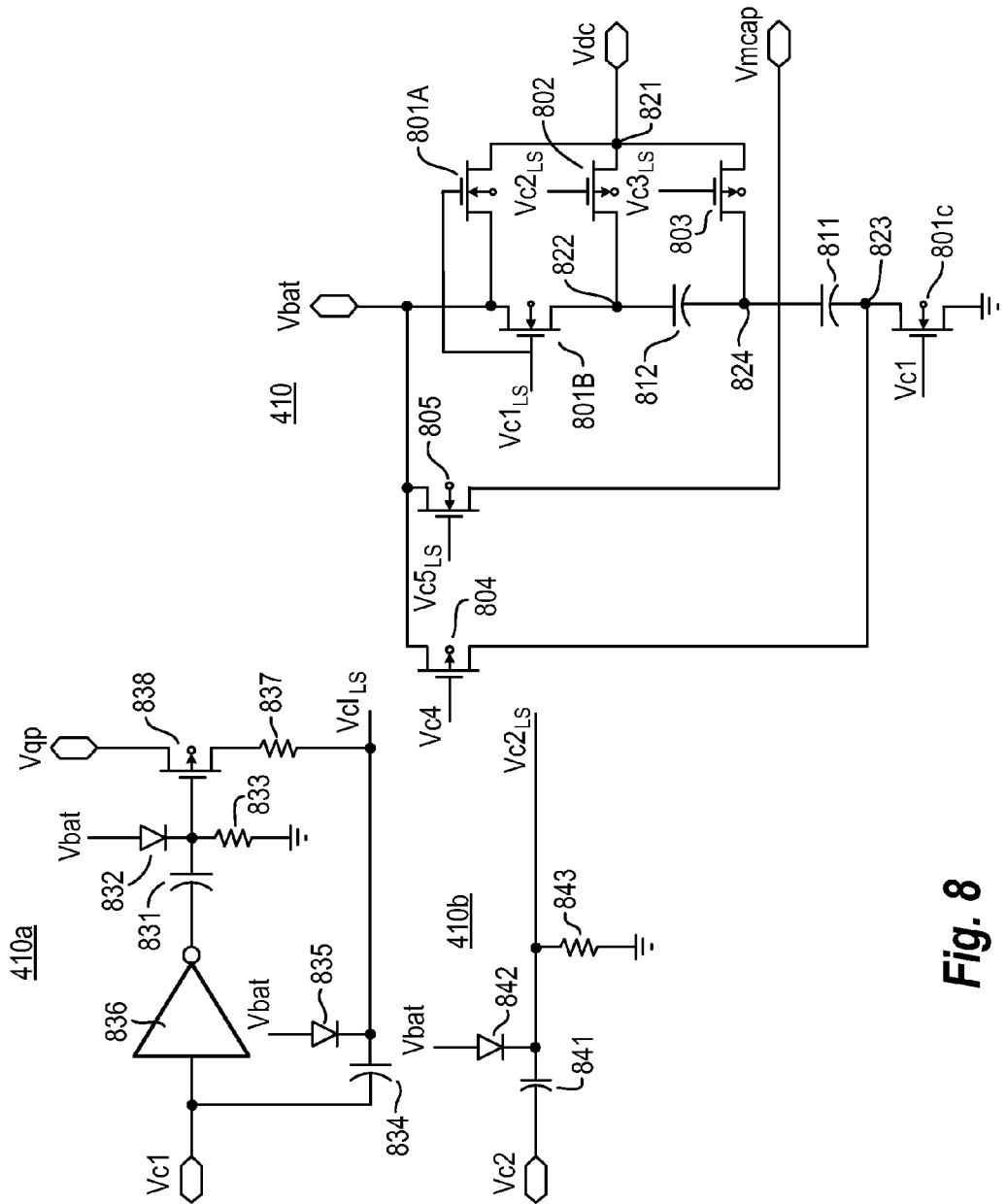
FIG. 8 is a circuit diagram illustrating a power switch of the DC controller, according to a representative embodiment.

In addition, the DC controller 130 includes fault recovery circuit 440 for detecting faults in the DC supply voltage Vdc, provided as a sample voltage by the power switch 410. Herein, a fault refers to an insufficiency in the boosted DC supply voltage Vdc as a result of excessive discharge of first charge storage capacitor 811 and/or second charge storage capacitor 812 of the power switch 410 (as shown in FIG. 8). Based on the fault detection, the fault recovery circuit 440 outputs an Enable signal to the switch sequencer 420 to selectively enable operation of the switch sequencer 420, discussed below with reference to FIGS. 13A to 13C. The fault recovery circuit 440 thus disables the boost voltage in case of a fault in both medium boost state MB and high boost state HB, for a time period which is sufficient to permit the first charge storage capacitor 811 and the second charge storage capacitor 812 of power switch 410 to fully recharge. The DC controller 130 also includes charge pump voltage source 450 for generating a charge pump voltage Vqp, which is approximately 1.5 to 2 times the battery voltage Vbat, discussed below with reference to FIG. 22.

Figure 5:
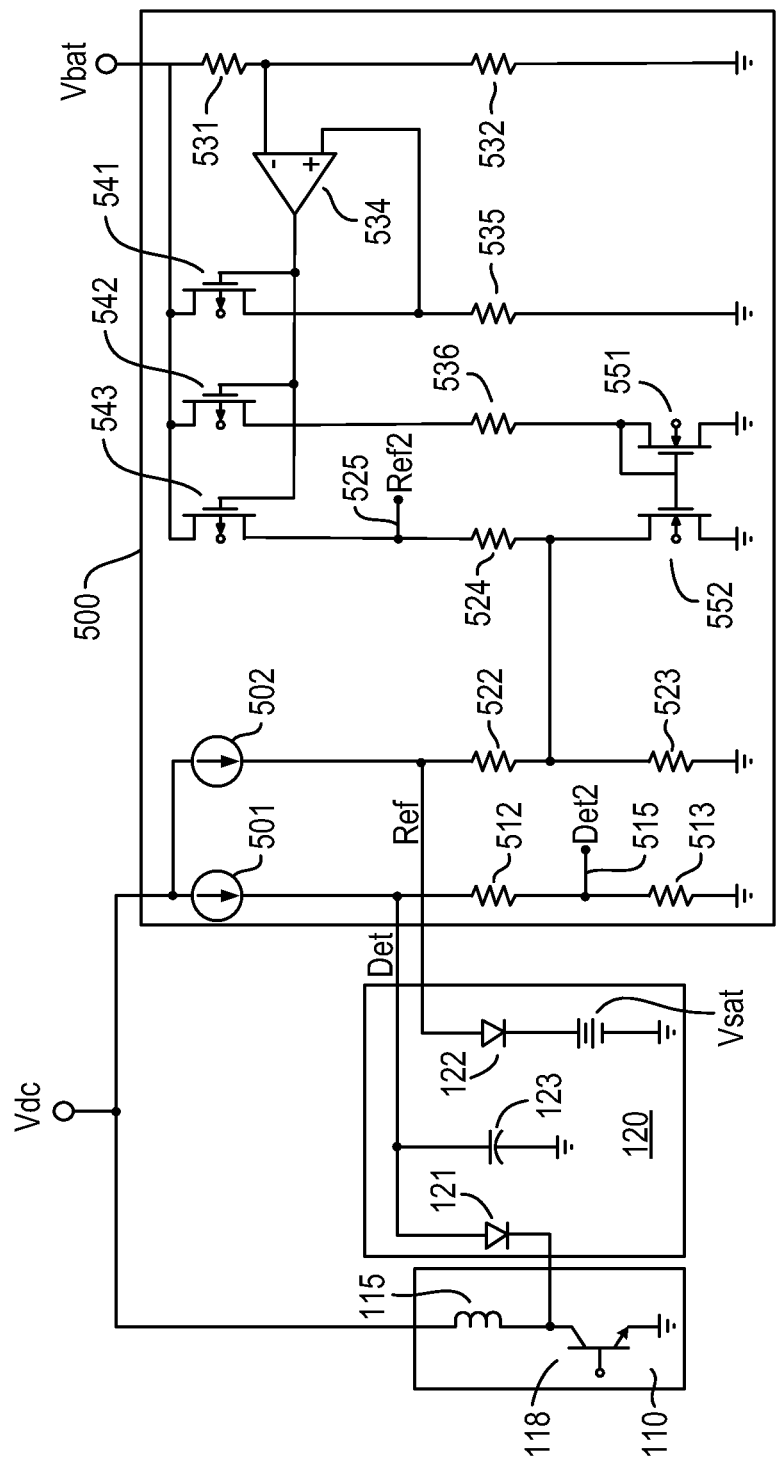
FIG. 5 is a circuit diagram of a detector bias circuit, together with the power amplifier stage and the detector, according to a representative embodiment.
Figure 6:
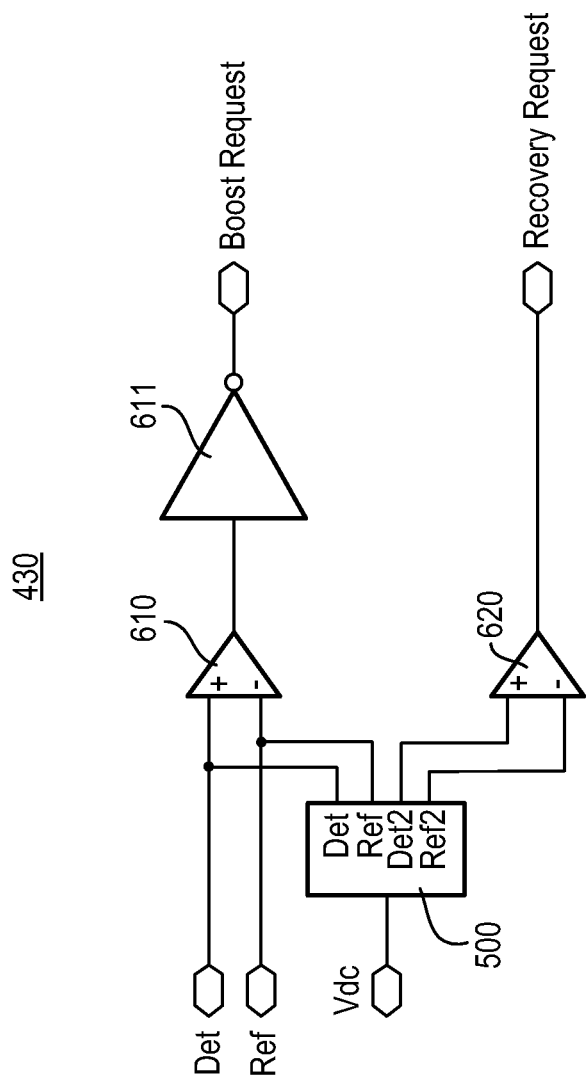
FIG. 6 is a block diagram illustrating a detector encoder of the DC controller, according to a representative embodiment.

FIG. 5 is a circuit diagram of a detector bias circuit 500, together with the power amplifier stage, indicated by output transistor 118 and inductor 115, and the detector 120, according to a representative embodiment. In the depicted embodiment, the detector bias circuit 500 is included within the detector encoder 430, as shown in FIG. 6, for example, although the detector bias circuit 500 may be configured separately or within another component without departing from the scope of the present teachings.

Referring to FIG. 5, the detector bias circuit 500 includes two identical detector bias current sources 501 and 502, which bias the detector diode 121 and the reference diode 122 of the detector 120, respectively. The detector bias current sources 501 and 502 are powered from the DC supply voltage Vdc output by the DC controller 130, enabling the detector bias current sources 501 and 502 to comply with the higher output voltage of the detector 120 when voltage boost is present. That is, the DC supply voltage Vdc supplies the detector bias current sources 501 and 502 with sufficient operating voltage to comply with the output of the detector 120 when boost is present.

During negative peaks of the output transistor 118, collector voltage at the detector diode 121 is forward biased, and the anode of the detector diode 121 follows the cathode. The cathode voltage is then stored in the capacitor 123. During more positive values of the collector voltage, the output voltage (detection signal Det) remains stored across the capacitor 123, hence detector diode becomes reverse biased and cannot discharge the capacitor 123. The capacitor 123 may be referred to as a video filter capacitor. The Det and Ref lines are coupled directly to the input ports of the boost comparator 610, as discussed below with reference to FIG. 6. When the negative peaks of the collector voltage of the output transistor 118 intercept the saturation voltage Vsat, the result is that the detection signal Det is equal to the reference signal Ref and the boost comparator 610 will switch states to initiate a boost event. Two additional output ports 515 and 525, for outputting scaled detection signal Det2 and scaled and offset reference signal Ref2, are provided as inputs to the recovery comparator 620, also as discussed below with reference to FIG. 6.

Recovery occurs when the output voltage of the DC controller 130 is boosted and the output power of the output transistor 118 is sufficiently low that boost is no longer needed (the lowest occurring voltage extreme is above the predetermined recovery threshold). In this case the output of the detector 120 is relatively high. To keep the voltages of the scaled detection signal Det2 and the scaled and offset reference signal Ref2 low enough to be in the operating range of the recovery comparator 620, the scaled detection signal Det2 is created by dividing detection signal Det down by the divider ratio determined by the values of resistors 512 and 513. The scaled and offset reference signal Ref2 is created by dividing the reference signal Ref down for the same reason by the values of resistors 522 and 523, and then adding a specific offset voltage Voffset dropped across resistor 524. It can be shown that the offset voltage is advantageously derived as a fraction of the battery voltage Vbat. The situation may be summarized by the Equations (1) and (2):

$$Det2 = \alpha * Det \quad (1)$$

$$Ref2 = (\alpha * Ref) + Voffset \quad (2)$$

The value $\alpha$ is the voltage divider ratio produced by resistors 512 and 513, and again by resistors 522 and 523. As previously stated, it is a value less than unity that keeps the inputs to the recovery comparator 620 within its operating range. The remaining circuitry of the detector bias circuit 500 includes a voltage divider, formed by resistors 531 and 532, to fractionate the battery voltage Vbat. Operational amplifier 534 biases PMOS transistors 541, 542 and 543 to achieve the same fractionated supply voltage at the non-inverting input of the operational amplifier 534. The current thus produced in resistor 535 connected to the non-inverting input of the operational amplifier 534 is mirrored by the circuit comprising resistor 536 and mirror PMOS transistors 551 and 552, so that this current, or a known scaled version of this current, is forced through the resistor 524.

A boost event is instigated when the negative peaks of the collector voltage of output transistor 118 reach the value of saturation voltage Vsat, a predetermined value at which the output transistor 118 begins to saturate. Representing the detector diode 121 forward voltage drop as Vf, the detector output voltages immediately before a boost event may be written as Equations (3) and (4):

$$Det = Vsat + Vf \tag{3}$$

$$Ref = Vsat + Vf \tag{4}$$

Immediately after the boost event, the detection and reference signals are provided by Equation (5):

$$Det = Vsat + Vf + 0.5 Vbat \tag{5}$$

Assuming that an infinitesimal reduction in RF power from the power amplifier 110 would allow the boost to be forfeited, recovery is expected immediately after the boost occurs, in which case the scaled detection and reference signals Det2 and Ref2 are provided by Equations (6) and (7):

$$Det2 = alpha * (Vsat + Vf + 0.5 Vbat) \tag{6}$$

$$Ref2 = alpha * (Vsat + Vf) + Voffset \tag{7}$$

A recovery event is instigated when Det2=Ref2, from which the offset voltage Voffset may be solved according to Equation (8):

$$Voffset = \alpha * 0.5 Vbat \tag{8}$$

If $\alpha$ were chosen to be 0.5, for example, then the offset voltage Voffset would be 0.25Vbat. The battery voltage Vbat is typically 3.4V in a cell phone application, for example, hence Voffset=850 mV.

The situation described above may lead to system instability because a boost event would immediately trigger a recovery event. Thus, to stabilize the system, a small amount of hysteresis is needed. This hysteresis comes from the power amplifier 110 because, for efficiency purposes, the power amplifier 110 enters slightly into compression before the boost event is triggered. In this case the response of the negative peak detector 120 is slightly less than would be expected, e.g., it is slightly less than 0.5Vbat. Additionally, the actual voltage step produced by the DC controller 130 is less than 0.5Vbat due to losses in the power switch 410. The result is typically an excessive amount of hysteresis, with concomitant reduced efficiency. The hysteresis can be dropped to a more desirable value by reducing the offset voltage Voffset by a few hundred mV, for example.

The detection signal Det, the reference signal Ref, the scaled detection signal Det2, and the scaled reference signal Ref2 are then fed into the boost comparator and the recovery comparator, as shown in FIG. 6.

FIG. 6 is a block diagram illustrating a detector encoder 430 of the DC controller 130, according to a representative embodiment. Generally, the detector encoder 430 of the DC controller 130 encodes the detection and reference signals into a two bit digital word. Functions of detector encoder 430 include providing bias currents to the detector diode 121 and the reference diode 122, comparing the detection signal Det with the reference signal Ref, and comparing the scaled detection signal Det2 to the scaled and offset reference signal Ref2 to produce the Boost and Recovery Request signals, respectively.

Referring to FIG. 6, the Boost and Recovery Request signals provide input states for the switch sequencer 420 based on the analog detection signal Det and the analog reference signal Ref. In various embodiments, the detector encoder 430 includes the boost comparator 610 and the recovery comparator 620, mentioned above. The boost and recovery comparators 610 and 620 may be implemented as operational amplifiers, for example. The boost comparator 610 includes a positive (non-inverting) input that receives the detection signal Det from the detector 120, and a negative (inverting) input that receives reference signal Ref from the reference detector 120. The boost comparator 610 compares the detection signal Det and the reference signal Ref, and the comparison result is inverted by inverter 640 to output the Boost Request signal. The recovery comparator 620 includes a positive input that receives the scaled detection signal Det2 from the detector bias circuit 500, and a negative input that receives the scaled and offset reference signal Ref2 from the detector bias circuit 500. The recovery comparator 620 compares the scaled detection signal Det2 and the scaled reference signal Ref2, and outputs the Recovery Request signal as the comparison result.

In operation, when the detection signal Det falls below the reference signal Ref, e.g., which happens when the negative peak on the collector of the power amplifier 110 falls below the saturation voltage Vsat, the Boost Request signal output by the inverter 611 has a rising edge. Likewise, when the scaled detection signal Det2 rises above the scaled and offset reference signal Ref2, the Recovery signal output by the recovery comparator 620 has a rising edge, signaling a recovery request. Notably, a recovery event will not be triggered unless the magnitude of the envelope of the RF output signal Vout has fallen to a point where a recovery event will not result in compression. The value of the output voltage Vout at which recovery occurs, as determined by the value of Ref2, is important in that too low a value of Vout would result in wasted opportunity to reduce operating voltage, with resultant loss of efficiency.

A boost event results in a rise in the output of the detector 120 that is approximately equal to one voltage step of the DC controller 130. In a three-state system, for example, the voltage step may be about 0.5Vbat. Before a recovery event is permitted, some drop in envelope magnitude of the RF input signal Vin must occur so that the recovery event does not result in compression. Unless this drop is required for recovery, the system will become unstable (oscillate between boost and recovery). The required envelope magnitude drop must be small, so that recovery can be triggered as soon as it is possible. Late recovery would reduce efficiency. In the three-state system, for example, the negative peak voltage Vngpk at which recovery is possible is given by Equation (9), where Vhys is a small hysteresis margin voltage sufficient to keep the system stable:

$$Vngpk \sim Vsat + 0.5Vbat + Vhys \tag{9}$$

Under the condition of Equation (9), the detection signal Det may be provided by Equation (10), where Vf is the forward voltage drop of the detector diode 121:

$$Det = Vsat + Vf + 0.5Vbat + Vhys \tag{10}$$

Since the operating voltage step 0.5Vbat is much larger than hysteresis margin voltage Vhys (0.5Vbat>>Vhys), it is appropriate to create the offset voltage Voffset as a fractional representation of the battery voltage Vbat. By doing this, the solution is insensitive to the specific value of the battery voltage Vbat. The hysteresis margin voltage Vhys is small and can be determined by experimentation, for example. When the saturation voltage Vsat is set sufficiently low that a boost event is not triggered until a small amount of compression occurs in the power amplifier 110, then it is possible to operate with the hysteresis voltage Vhys less than or equal to 0V. This is because the compressed power amplifier 110 will produce a rise in the collector negative peak voltage that is somewhat smaller than the size of the operating voltage step (e.g., 0.5Vbat), and this reduced rise is sufficient to maintain stability of the system.

Figure 7:
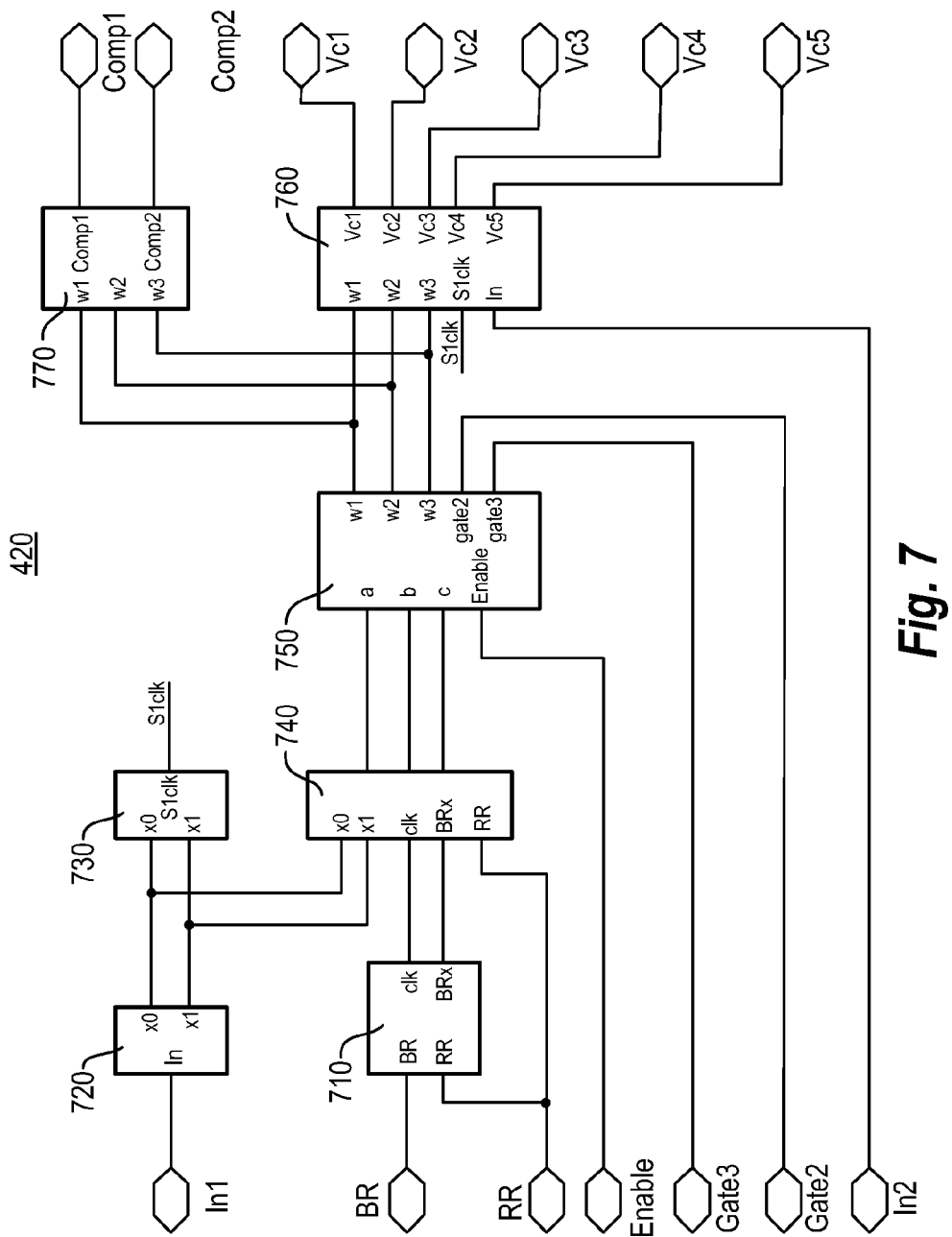
FIG. 7 is a circuit diagram illustrating a switch sequencer of the DC controller, according to a representative embodiment.

FIG. 7 is a circuit diagram illustrating the switch sequencer 420 of the DC controller 130, according to a representative embodiment.

Referring to FIG. 7, the switch sequencer 420 generally translates the Boost Request signal and the Recovery Request signal, output by the detector encoder 430 and received at port BR and port RR, respectively, into multiple control signals for controlling operations of the power switch 410. The switch sequencer 420 also receives the DC supply voltage Vdc output by the power switch 410 (which is also output by the DC controller 130) at input port In1, mid-capacitor voltage Vmcap output by the power switch 410 at input port In2, and Enable signal output by the fault recovery circuit 440 at port Enable. In the depicted embodiment, the control signals include first control bit Vc1, second control bit Vc2, third control bit Vc3, fourth control bit Vc4, and fifth control bit Vc5, which are provided to the power switch 410. The switch sequencer 420 also outputs first and second compensation control signals Comp1 and Comp2 to the compensation the control circuit 200. Additionally, the switch sequencer 420 outputs the Gate2 and Gate3 signals to the fault recovery circuit 440. Generally, the purpose of the switch sequencer 420 is to operate the power switch 410 into a pass-through state and multiple boost states, as needed. The switch sequencer 420 is discussed in detail, below, following discussion of the power switch 410.

FIG. 8 is a circuit diagram illustrating the power switch 410 of the DC controller 130, according to a representative embodiment.

Referring to FIG. 8, the power switch 410 receives the first through fifth control bits Vc1 to Vc5 from the switch sequencer 420, and outputs the supply voltage Vdc to the power amplifier 110 in one of three modes, in accordance with the first through fifth control bits Vc1 to Vc5. The power switch 410 also outputs mid-capacitor voltage Vmcap at the common node connection (fourth node 824) between the first and second charge storage capacitors 811 and 812, which enables monitoring of charge symmetry between the first and second charge storage capacitors 811 and 812.

The power switch 410 includes first transistor 801A, second transistor 801B, third transistor 801C, fourth transistor 802, fifth transistor 803, sixth transistor 804 and seventh transistor 805, which are controlled by the first through fifth control bits Vc1 to Vc5, respectively. More particularly, in the depicted embodiment, the first transistor 801A is an NMOS FET that includes a gate controlled by the first control bit Vc1, a source connected to the battery voltage Vbat, and a drain connected to first node 821 (output node for DC supply voltage Vdc) located at the output for providing the DC supply voltage Vdc. The second transistor 801B is an NMOS FET that includes a gate controlled by the first control bit Vc1, a source connected to second node 822 located between the second capacitor 612 and the fourth transistor 802. The third transistor 801C is an NMOS FET that includes a gate controlled by the first control bit Vc1, a source connected to ground, and a drain connected to third node 823 located between the sixth transistor 804 and the first charge storage capacitor 811. The fourth transistor 802 is a PMOS FET that includes a gate controlled by the second control bit Vc2, a source connected the second node 822, and a drain connected to the first node 821. The fifth transistor 803 is a PMOS FET that includes a gate controlled by the third control bit Vc3, a source connected to the first node 821, and a drain connected to a fourth node 824 (output node for mid-capacitor voltage Vmcap) located between the first and second charge storage capacitors 811 and 812. The sixth transistor 804 is a PMOS FET that includes a gate controlled by the fourth control bit Vc4, a source connected to the battery voltage Vbat, and a drain connected to the third node 823. The seventh transistor 805 is an NMOS FET that includes a gate controlled by the fifth control bit Vc5, a source connected to the fourth node 824, and a drain connected to the battery voltage Vbat.

In the depicted embodiment, the first, second, third and seventh transistors 801A, 801B, 801C and 805 are NMOS FETs, and the fourth, fifth and sixth transistors 802, 803 and 804 are PMOS FETs. However, other types of FETs and/or other types of transistors may be incorporated without departing from the scope of the present teachings. Further, for clarity, body contacts of the various NMOS and PMOS FETs throughout the figures and specification have not been shown with respect to where and how they may be connected/biased. However, such configurations would be apparent to one of ordinary skill in the art.

In the depicted embodiment, the power switch 410 has four states: state 1, state 2A, state 2B, and state 3. State 1, defined as the Vbat pass-through state, is achieved by turning on the first transistor 801A, the second transistor 801B, the third transistor 801C and the fourth transistor 802, and turning off the other transistors. In state 1, the battery voltage Vbat is passed through the first transistor 801A to the first node 821 to be output as the DC supply voltage Vdc, which is provided to the output transistor 118 of the power amplifier 110. Also in state 1, the first and second charge storage capacitors 811 and 812 are connected between the battery voltage Vbat and ground though the second transistor 801B and the third transistor 801C, which allows them to collectively charge up to the battery voltage Vbat. That is, each of the first and second charge storage capacitors 811 and 812 charge to a capacitor voltage value of about 0.5Vbat. The first and second charge storage capacitors 811 and 812 normally have the same capacitance value, so that one can consider same voltage and same charge interchangeably.

State 2A, defined as the first of two boost states producing 1.5Vbat, is achieved by turning on the fifth transistor 803 and the sixth transistor 804, and turning of the other transistors. In state 2A, the top of the first charge storage capacitor 811 is connected to the first node 821 via the fifth transistor 803, and the bottom of the first charge storage capacitor 811 is connected to the battery voltage Vbat via the sixth transistor 804. The voltage across the first charge storage capacitor 811 is Vbat/2, hence the load at the first node 821 sees approximately 1.5Vbat. State 2B, defined as the second of two boost states producing 1.5Vbat, is achieved by turning on the fourth transistor 802 and the seventh transistor 805, and turning off the other transistors. In state 2B, the top of the second charge storage capacitor 812 is connected to the first node 821 via the fourth transistor 802, and the bottom of the second charge storage capacitor 812 is connected to the battery voltage Vbat via the seventh transistor 805. The voltage across the second charge storage capacitor 812 is Vbat/2, hence the load at the first node 821 sees approximately 1.5Vbat.

State 3, defined as the boost state producing 2Vbat, is achieved by turning on the fourth transistor 802 and the sixth transistor 804, and turning off the other transistors. In state 3, the top of the second charge storage capacitor 812 is connected to the first node 821 via the fourth transistor 802, and the bottom of the first charge storage capacitor 811 is connected to the battery voltage Vbat via the sixth transistor 804. The voltage across the series combination of the first and second charge storage capacitors 811 and 812 is Vbat, hence the load at the first node 821 sees approximately 2Vbat.

The type of FET, i.e. NMOS or PMOS, for each of the first through seventh transistors 801A to 805 is chosen in each case depending on the voltages that are being switched, in such a way that the resultant gate drive voltage is between 0V and 2Vbat, and the required magnitude of voltage step at each gate to switch each of the first through seventh transistors 801A to 805 between on and off states is Vbat. Under this constraint, all gates may be driven from Vbat biased logic having state swing of Vbat and level shifted by approximately Vbat, as necessary. Further, as mentioned above, the first, second, third and seventh transistors 801A, 801B, 801C and 805 are chosen to be NMOS FETs, and the fourth, fifth and sixth transistors 802, 803 and 804 are chosen to be PMOS FETs. Also, the first, second, fourth, fifth and seventh transistors 801A, 801B, 802, 803 and 805 each require level shifting, while the third and sixth transistors 801C and 804 are driven directly from battery voltage Vbat biased logic. This situation is described in the Table 1, which shows (approximated) gate voltages (Vg) of the transistors, for purposes of illustration.

TABLE 1

| State | Vg801A NMOS | Vg801B NMOS | Vg801C NMOS | Vg802 PMOS | Vg803 PMOS | Vg804 PMOS | Vg805 NMOS |
|---|---|---|---|---|---|---|---|
| on | 2Vbat | 2Vbat | Vbat | Vbat | Vbat | 0 | 2Vbat |
| off | Vbat | Vbat | 0 | 2Vbat | 2Vbat | Vbat | Vbat |

The states are summarized in the Table 2 as follows:

TABLE 2

| 801A | 801B | 801C | 802 | 803 | 804 | 805 | State |
|---|---|---|---|---|---|---|---|
| on | on | on | on | off | off | off | 1 |
| off | off | off | off | on | on | off | 2A |
| off | off | off | on | off | off | on | 2B |
| off | off | off | on | off | on | off | 3 |

From Table 2, it can be seen that the first, second and third transistors 801A, 801B and 801C switch together. In other words, they are either all on or all off. Therefore, the first, second and third transistors 801A, 801B and 801C may be driven by a single control line (in this example, Vc1), and thus the power switch 410 may be controlled by a five bit parallel bus. Of course, the transistors may be driven by separate control signals in various embodiments, without departing from the scope of the present teachings.

Accordingly, the third transistor 801C is driven directly by the first control bit Vc1 from a corresponding bus line, and the sixth transistor 804 is driven directly by the fourth control bit Vc4 from a corresponding bus line. The first and second transistors 801A and 801B are driven by the first control bit Vc1 after level shifting, indicated in FIG. 8 as Vc1$_{LS}$. The fourth transistor 802 is driven by the second control bit Vc2 from a corresponding bus line after level shifting, indicated as Vc2$_{LS}$. The fifth transistor 803 is driven by the third control bit Vc3 from a corresponding bus line after level shifting, indicated as Vc3$_{LS}$. The seventh transistor 805 is driven by the fifth control bit Vc5 from a corresponding bus line after level shifting, indicated as Vc5$_{LS}$.

FIG. 8 depicts level shifters 410a and 410b corresponding to the level shifting requirements of the control bit bus lines discussed above. Each of the first control bit Vc1 and the third control bit Vc3 are level shifted by a corresponding level shifter 410a, although only the level shifter 410a used for level shifting the first control bit Vc1 is depicted and discussed for the sake of convenience. Likewise, each of the second control bit Vc2 and the fifth control bit Vc5 are level shifted by a corresponding level shifter 410b, although only the level shifter 410b used for level shifting the second control bit Vc2 is depicted and discussed for the sake of convenience. It is understood that the level shifters 410a and 410b function in substantially the same manner described below for the third control bit Vc3 and the fifth control bit Vc5, respectively, to provide the level shifted third control bit Vc3$_{LS}$ and the level shifted fifth control bit Vc5$_{LS}$. The fourth control bit Vc4 does not require a level shifter.

The level shifter 410b is a simple diode RC level shifter. The level shifter 410b includes capacitor 841 connected between an input to receive the second control bit Vc2 and an output to provide the level shifted second control bit Vc2$_{LS}$. Diode 842 is connected between the battery voltage Vbat and the output, and resistor 843 is connected between the output and ground. Thus, the level shifter 410b operates by charging up the capacitor 841 through the diode 842 when the second control bit Vc2 is in the low state. When second control bit Vc2 is in the high state, the voltage across the capacitor 841 is added to the bus voltage to produce an offset of about Vbat−Vf, where Vf is the forward voltage drop across the diode 842. The resistor 843 ensures that the level shift does not float to some higher value than Vbat−Vf. Hereafter the magnitude of level shift will be referred to simply as Vbat. Proper operation of the level shifter 410b requires that the capacitor 841 stays charged, and due to various leakage currents that are inevitable, this requires continual assertion of logic low on the corresponding bus lines.

The level shifter 401a is a more sophisticated circuit. The reason for this is found by observing that the power switch 410 may remain in state 1 for an extended period of time, such as would happen if the power requirement from the power amplifier 110 were very low. In this case, the first transistor 801A and the second transistor 801B must remain on, requiring a level shifted logic high. Also, the fifth transistor 803 must remain off, and also requiring a level shifted logic high. Without the additional level shifter circuitry depicted in the level shifter 410a, capacitor 834 may eventually discharge causing the level shift voltage to collapse.

To prevent this, inverter 836 produces a logic low, which is level shifted by a level shifter comprised of capacitor 831, diode 832 and resistor 833. This level shifted logic low is then fed to the gate of transistor 838, which is a PMOS FET, the source of which is biased by a charge pump voltage Vqp which is approximately 2Vbat. Thus the transistor 838 is held in the on state whence the charge pump voltage Vqp is coupled to the output of the level shifter 410a through resistor 837. The resistor 837 then supplies whatever leakage current is demanded by the capacitor 834, including its own leakage current, so that the capacitor 834 is prevented from discharging. If the capacitor 831 were to discharge, the transistor 838 would remain on, so that the level shifted first control bit Vc1, i.e. $Vc1_{LS}$, remains level shifted indefinitely. When the first control bit Vc1 goes low, the gate of the transistor 838 goes high, e.g. to approximately 2Vbat, which turns off the transistor 838 and allows the level shifted first control bit $Vc1_{LS}$ to achieve a logic low. One need not consider the case where the first control bit Vc1 is held in the low state indefinitely, thus causing an eventual collapse in the level shifted logic high appearing at the gate of the transistor 838 because the DC controller 130 cannot remain in a boosted state indefinitely.

The drive bus states and the corresponding states of the power switch 410 are summarized in the Table 3 below:

TABLE 3

| Vc1 | Vc2 | Vc3 | Vc4 | Vc5 | state |
|---|---|---|---|---|---|
| 1 | 0 | 1 | 1 | 0 | 1 |
| 0 | 1 | 0 | 0 | 0 | 2A |
| 0 | 0 | 1 | 1 | 1 | 2B |
| 0 | 0 | 1 | 0 | 0 | 3 |

It is the task of the switch sequencer 420 to produce these four 5-bit words (states 1, 2A, 2B, 3) in accordance with the voltage needed by the power amplifier 110 at each point in time.

Referring again to FIG. 7, the switch sequencer 420 is configured to drive the power switch 410 into each of the various modes or states (e.g., four states for providing three voltage levels in the depicted embodiment) and to transition between the states with the correct sequence so that no shoot-through current occurs in the power switch 410. More specifically, the switch sequencer 420 sequences the transitions among states, for example, so that at no time are first and second charge storage capacitors 811 and 812 (depicted in FIG. 8) shorted by the power switch 410. If shoot-through current were to occur, it would negatively impact efficiency. The switch sequencer 420 is able to generate the first through fifth control bits Vc1 to Vc5 as control signals to drive the power switch 410 in the various states. In the depicted embodiment, the switch sequencer 420 include various encoders, including clock encoder 710, x-encoder 720, S1 clock encoder 730, abc-encoder 740, w-encoder 750, driver decoder 760 and compensation decoder 770, each of which are described below. Generally, operation of the switch sequencer 420 begins with the Boost Request signal and the Recovery Request signal received at the ports BR and RR, respectively, from the detector encoder 430. When the power amplifier 110 requires boost, the detector encoder 430 asserts a rising edge from the Boost Request signal to trigger a boost event. When boost is no longer needed, the detector encoder 430 asserts a rising edge from the Recovery Request signal to trigger a recovery event. The DC supply voltage Vdc output by the DC controller 130 is provided as an input to the input port In1 of the switch sequencer 420 as a means of indicting the present state of the DC controller 130 at the time the event request is made by the power amplifier 110. With these three pieces of information the DC controller 130 can take the appropriate action, as shown in Table 4 below:

TABLE 4

| Current State | Event Requested | Required Action |
|---|---|---|
| State 1 | Recovery | None |
| State 1 | Boost | Switch to State 2 |
| State 2 | Recovery | Switch to State 1 |
| State 2 | Boost | Switch to State 3 |
| State 3 | Recovery | Switch to State 2 |
| State 3 | Boost | None |

In addition to these tasks, the DC controller 130 is able to evaluate the charge on the charge storage capacitors 811 and 812 of the power switch 410, and to take the appropriate action to maintain sufficiency and symmetry of the charge. Sufficiency is typically not a problem under normal operation, but in case of excessive input power to the power amplifier 110 and the resultant low occupancy of state 1, the charges of the charge storage capacitors 811 and 812 may become depleted. If this happens during either state 2 or state 3, the charges can be restored by reverting to and sustaining state 1 for a predetermined period of time. Detecting and initiating restoration for such a discharge problem is performed by the fault recovery circuit 440, discussed below. The switch sequencer 420 includes the facilities that permit execution of the charge recovery task.

In accordance with the fault recovery mentioned above, the DC supply voltage Vdc output by the DC controller 130 is sampled to determine the adequacy of charge as revealed by the DC supply voltage Vdc in state 2 and state 3. This sampling is performed through input port In of the fault recovery circuit 440, in accordance with FIG. 4, discussed above.

Also, as mentioned above, mid-capacitor voltage Vmcap is output by the power switch 410 at the fourth node 824, located between the first and second charge storage capacitors 811 and 812. The mid-capacitor voltage Vmcap is fed back to the switch sequencer 420 via the input port In2 to enable monitoring of the charge symmetry between the first and second charge storage capacitors 811 and 812 and triggering appropriate action to maintain symmetry. More specifically, a charge manager circuit in the driver decoder 760, discussed below, compares the charges of the first and second charge storage capacitors 811 and 812 of the power switch during state 1. The next time state 2 is needed, the charge manager circuit directs the power switch to use the one of the first and second charge storage capacitors 811 and 812 with the most charge, thus continually steering the charge toward symmetry between the first and second charge storage capacitors 811 and 812.

Figure 9A:
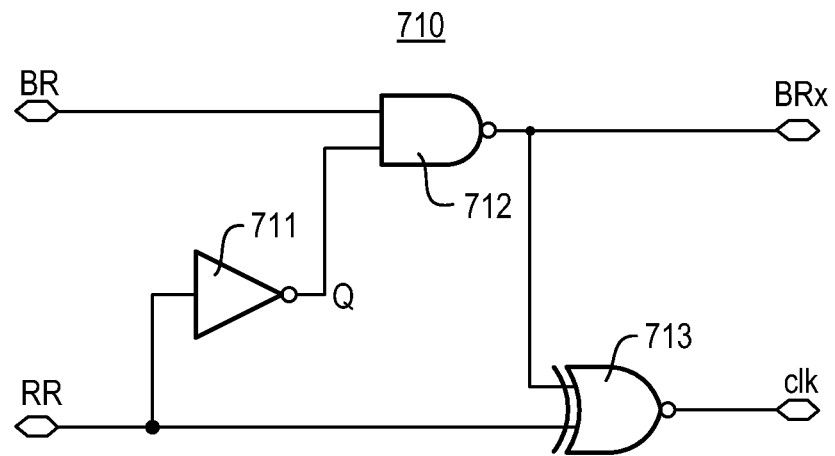
FIG. 9A is a logic circuit diagram of a clock encoder of the switch sequencer, according to a representative embodiment.

FIG. 9A is a logic circuit diagram of the clock encoder 710 of the switch sequencer 420, according to a representative embodiment. The clock encoder receives the Boost Request signal at port BR and the Recovery Request signal at port RR. The clock encoder 710 includes inverter 711 that inverts the Recovery Request signal, NAND gate 712 that performs a NAND operation on the Boost Request signal and the Recovery Request signal, and exclusive NOR gate 713 that performs an exclusive NOR operation on the output of the NAND gate 712 and the Recovery Request signal. The output of the NAND gate 712 is provided to BRx output as BRx signal, and the output of the exclusive NOR gate 713 is provided to clk output as clk signal.

The purpose of the clock encoder 710 is to produce a rising edge on the clk output in response to a request by the power amplifier 110 for an event, whether a boost event or a recovery event. The BRx output is used to identify the request as corresponding to a boost event or a recovery event. Table 5 provides a truth table reflecting the illustrative configuration of the clock encoder 710.

TABLE 5

| BR | RR | BRx | clk | Description |
|---|---|---|---|---|
| 0 | 0 | 1 | 0 | Amplifier Satisfied |
| 1 | 0 | 0 | 1 | Boost Request |
| 0 | 1 | 1 | 1 | Recovery Request |
| 1 | 1 | 1 | 1 | N/A |

Table 5 shows that the clk signal transitions from 0 to 1 when an event is requested. The BRx signal is 0 or 1 depending on whether the request is for a boost event or a recovery event, respectively.

Figure 9B:
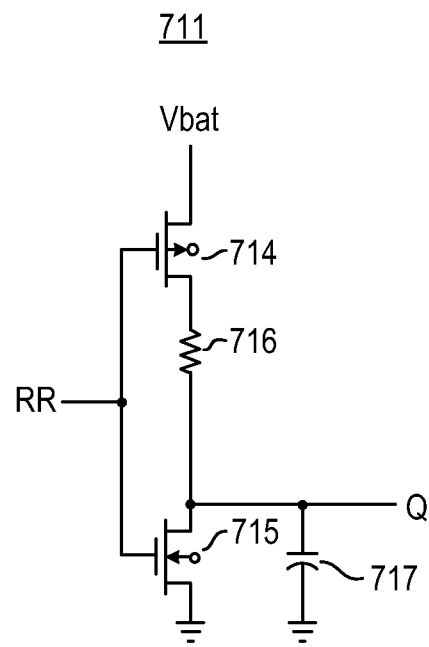
FIG. 9B is a circuit diagram showing an inverter of the clock encoder 710, according to a representative embodiment.

FIG. 9B is a circuit diagram showing inverter 711 of the clock encoder 710, according to a representative embodiment. The inverter 711 is of the slow rise variety, and includes first transistor 714, second transistor 715, resistor 716 connected between the source of the first transistor 714 and the drain of the second transistor 715, and capacitor 717 connected to the drain of the second transistor 715. The first transistor 714 is a PMOS FET and the second transistor 715 is an NMOS FET, both of which are gated by the Recovery Request signal. It is evident from FIG. 9A that the clock encoder 710 cannot respond to a Boost Request signal until the preceding Recovery Request signal has abated, and the output of the inverter 711 has risen to a value of 1. The slow rise characteristic of the inverter 711 ensures that the recovery has settled before allowing a Boost Request signal to be clocked, thus enhancing the stability of the system.

Figure 10:
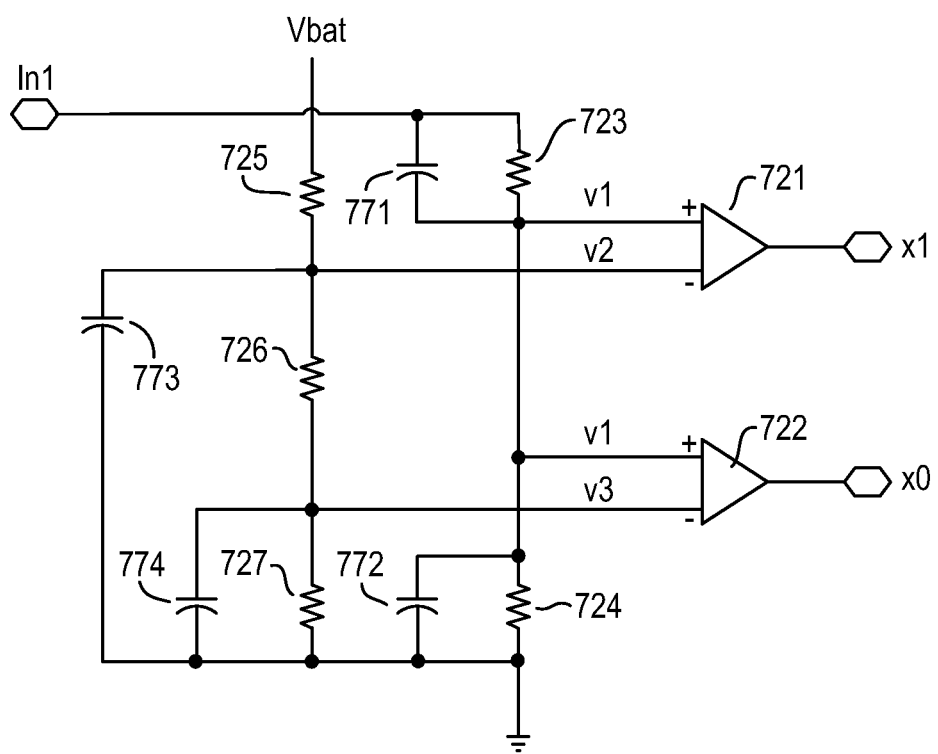
FIG. 10 is a circuit diagram of an x-encoder of the switch sequencer, according to a representative embodiment.

FIG. 10 is a circuit diagram of the x-encoder 720 of the switch sequencer 420, according to a representative embodiment. Generally, it is not sufficient simply to know whether a boost event or a recovery event is requested by the power amplifier 110. The current state of the DC controller 130 must also be known before the specific action in response to the requested boost event or recovery event can be determined. The x-encoder 720 is used to discern the current output state of the DC controller 130 at the time the event request is made by the power amplifier.

Referring to FIG. 10, the x-encoder 720 includes first and second comparators 721 and 722, each receiving a fractionated sampling voltage v1 of the DC supply voltage Vdc output by the DC controller 130 by way of the input port In1. The fractionated sampling v1 is coupled to the non-inverting input of each of the first comparator 721 and the second comparator 722. Resistor 723 is connected between the non-inverting input of the first comparator 721 and the input port In1, and resistor 724 is connected between the non-inverting input of the second comparator 722 and ground. A resistive voltage divider provides reference voltages v2 and v3 to the inverting inputs of the first comparator 721 and the second comparator 722, respectively. The voltage divider includes resistors 725, 726 and 727 connected between the power supply port Vbat and ground, where the reference voltage v2 is the voltage between resistors 725 and 726 and the reference voltage v3 is the voltage between resistors 726 and 727.

From FIG. 10, it can be seen that v3<v2. If v1<v3 then the DC controller 130 is deemed to be in state 1 and the outputs x0 and x1 are both 0. The values of resistors 723 and 724 are chosen so that the fractionated sampling v1 is always within the operating range of the first and second comparators 721 and 722. Resistors 725, 726 and 727 are chosen so that the following statements are true:

v1<v3, state 1 of DC controller 130
v3<v1<v2, state 2 of DC controller 130
v1>v2, state 3 of DC Controller 130

Thus the circuit's behavior is summarized in Table 6 below:

TABLE 6

| DC Controller State | x0 | x1 |
|---|---|---|
| state 1 | 0 | 0 |
| state 2 | 1 | 0 |
| state 3 | 1 | 1 |

Capacitors 771-774 provide displacement current needed by the inputs of the first comparator 721 and the second comparator 722 during rapid slewing of the DC supply voltage Vdc. Capacitor 771 is connected in parallel with resistor 723. Capacitor 772 is connected in parallel with resistor 724. Capacitor 774 is connected in parallel with resistor 727. Capacitor 773 is connected in parallel with the circuit containing capacitor 774 and resistors 726 and 727. More particularly, the ratio of values of 1/capacitor 771 to 1/capacitor 772 is preferably equal to the ratio of values of resistor 723 to resistor 724. This ensures that the x-encoder 720 settles quickly after a state change of the DC controller 130. In an alternate embodiment, the switch sequencer 420 does not include the x-encoder 720, and the x0 and x1 bits are taken directly from the Comp1 and Comp2 bits, respectively.

Figure 11A:
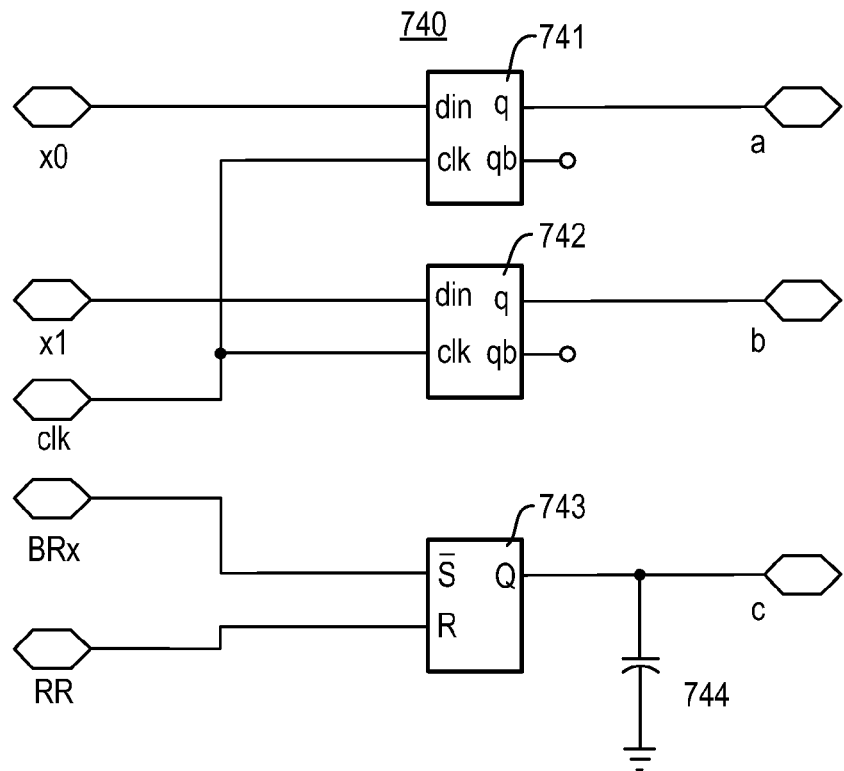
FIG. 11A is a circuit diagram of an abc-encoder of the switch sequencer, according to a representative embodiment.
Figure 11B:
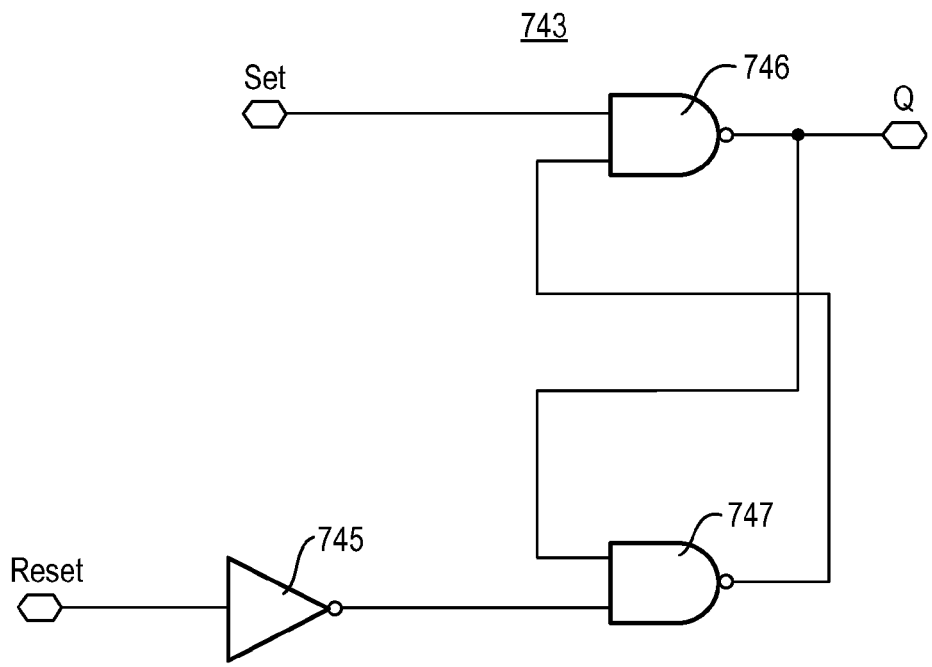
FIG. 11B is a logic circuit diagram of an SR-latch in the abc-encoder, according to a representative embodiment.

FIG. 11A is a circuit diagram of the abc-encoder 740 of the switch sequencer 420, according to a representative embodiment. FIG. 11B is a logic circuit diagram of an SR-latch in the abc-encoder, according to a representative embodiment.

Generally, the purpose of the abc-encoder 740 is to combine the event requests of the power amplifier 110 together with the current state of the DC controller 130 at the time of the requests, and to generate response codes in the form of output signals a, b and c that will instruct the power switch 410 to take the appropriate action. The abc-encoder 740 includes latches 741 and 742 for latching the values of the inputs x0 and x1 (provided by the x-encoder 720) to outputs a and b, respectively, to provide output signals a and b when the clock signal clk has a rising edge. Based on the foregoing explanations, it can be stated that the inputs x0 and x1 together represent the instantaneous output voltage state of the DC controller 130 at the time that an event request is asserted, and those values of the inputs x0 and x1 are latched to outputs a and b, respectively. The abc-encoder 740 performs another independent operation using SR-latch 743, which latches the BRx signal and the Recovery Request signal to output c to provide output signal c. Capacitor 744 is connected between the output of the SR-latch 743 and ground.

Referring to FIG. 11B, the SR-latch 743 includes inverter 745, and NAND gates 746 and 747. The BRx signal is fed into the traditional Set input, the Recovery Request signal is fed into the inverted Reset input, and Q output provides the output signal c of the SR-latch 743. The inverter 745 inverts the Recovery Request signal. The NAND gate 746 performs a NAND operation on the BRx signal and the output of the NAND gate 747, and the NAND gate 747 performs a NAND operation on the inverted Recovery Request signal and the output of the NAND gate 746. The output of the NAND gate 746 provides the Q output of the SR-latch 743.

Table 7 describes the function of the output signal c portion of the abc-encoder 743, according to a representative embodiment:

TABLE 7

| BRx | RR | c | Amplifier Condition |
|---|---|---|---|
| 0 | 0 | 1 | Boost Request |
| 1 | 0 | 1 | Satisfied |
| 1 | 1 | 0 | Recovery Request |
| 1 | 0 | 0 | Satisfied |

Table 7 shows that a boost request results in a 1 at the output of the abc-encoder 743, and the 1 persists until a recovery request is asserted. The output goes to 0 for a recovery request, and the 0 persists until a boost request is asserted. So, the output signal c of the SR-latch 743 is a one-bit word that corresponds to the last event request made by the power amplifier 110.

All together the abc-encoder produces a three-bit word that describes the last event request made by the power amplifier 110, together with the state of the DC controller 130 at the time the request was asserted. This is sufficient information for the DC controller 130 to determine what action to take. For example, if the power amplifier 110 requests a boost event (via Boost Request signal) and the DC controller 130 is in state 1 at the time of the boost request, the DC controller 130 will change to state 2. If the DC controller 130 is in state 3 at the time of the request, the DC controller 130 will take no action. If the power amplifier 110 requests a recovery event (via Recovery Request signal) and the DC controller 130 is in state 2 at the time of the recovery request, the DC controller will change to state 1. If the DC controller 130 is in state 1 at the time of the recovery request, the DC controller 130 will take no action. The logic that facilitates these responses will be described later, but for now it is sufficient to see that the abc-encoder 740 provides all of the necessary information for the DC controller 130 to take the correct action. These results are summarized in Table 8 below:

TABLE 8

| a | b | c | Request Time State | Request | Action |
|---|---|---|---|---|---|
| 0 | 0 | 0 | State 1 | Recovery | Remain in State 1 |
| 0 | 0 | 1 | State 1 | Boost | Switch to State 2 |
| 1 | 0 | 0 | State 2 | Recovery | Switch to State 1 |
| 1 | 0 | 1 | State 2 | Boost | Switch to State 3 |
| 1 | 1 | 0 | State 3 | Recovery | Switch to State 2 |
| 1 | 1 | 1 | State 3 | Boost | Remain in State 3 |

Figure 12:
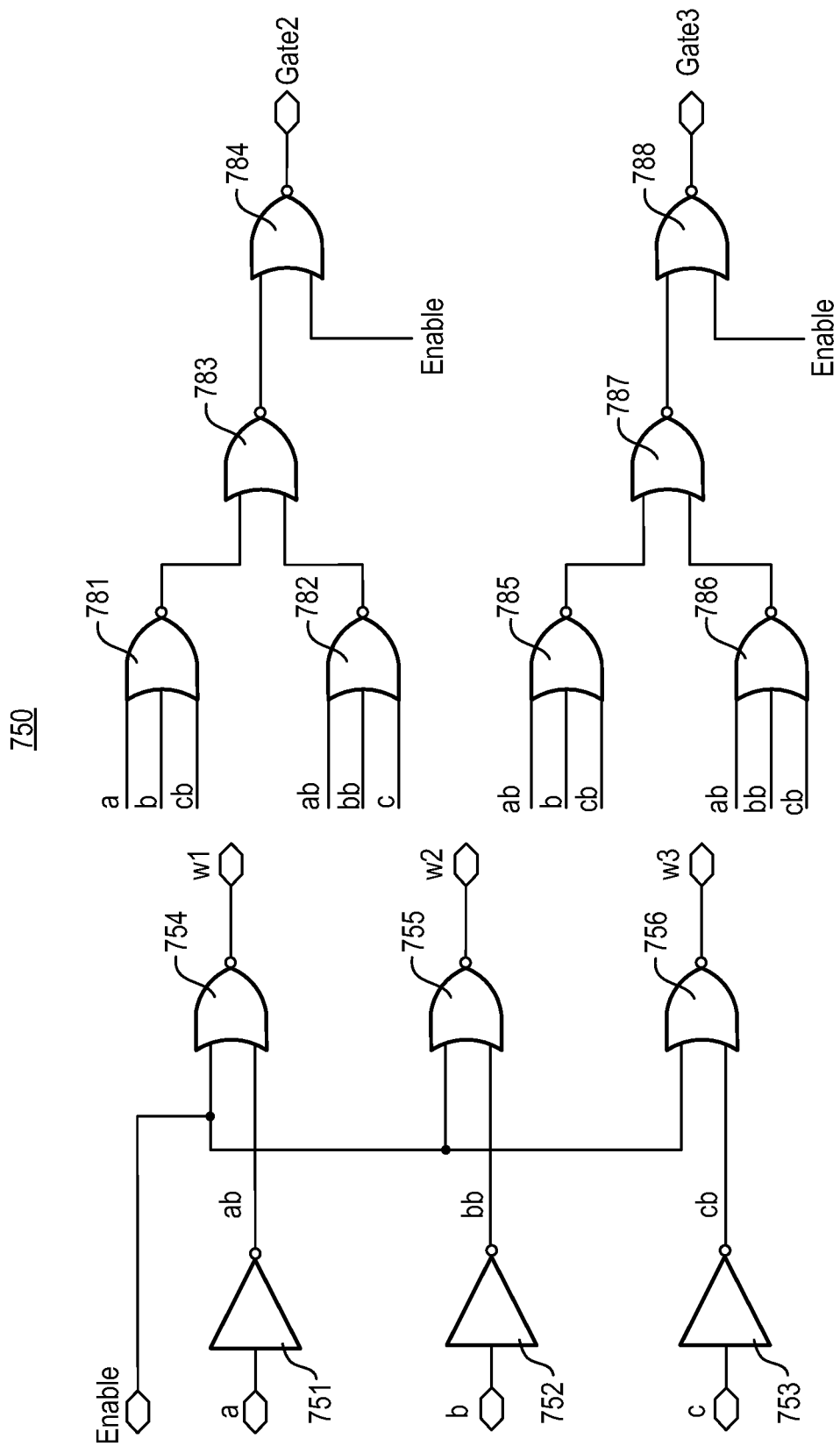
FIG. 12 is a circuit diagram of w-encoder of the switch sequencer, according to a representative embodiment.

FIG. 12 is a circuit diagram of the w-encoder 750 of the switch sequencer 420, according to a representative embodiment. Generally, the purpose of the w-encoder 750 is to facilitate boost lockout when a capacitor discharge fault is detected. This is accomplished by receiving Enable signal from the fault recovery circuit 440, which is normally set to a value of 0 when no fault is present.

Referring to FIG. 12, the w-encoder 750 performs a pass-through operation and a gate signal generation operation. The pass-through operation is performed by inverters 751 to 753 and NOR gates 754 to 756. The inverters 751, 752 and 753 are configured to invert output signals a, b and c, and to provide at their outputs inverted signals ab, bb, and cb, respectively. The NOR gates 754, 755 and 756 are configured to perform NOR operations on the inverted signals ab, bb and cb and the Enable signal, respectively, to provide the output signals w1, w2 and w3, respectively. The gate signal operation is performed by NOR gates 781 to 788. The NOR gates 781, 782, 785 and 786 are each configured to perform NOR operations on the output signals a, b and c, and the inverted signals ab, bb, and cb, in specific combinations, as shown. The NOR gate 783 is configured to perform a NOR operation on the output of the NOR gates 781 and 782, and the NOR gate 787 is configured to perform a NOR operation on the output of the NOR gates 785 and 786. The NOR gate 784 is configured to perform a NOR operation on the output of the NOR gate 783 and the Enable signal to provide the Gate2 signal, and the NOR gate 788 is configured to perform a NOR operation on the output of the NOR gate 787 and the Enable signal to provide the Gate3 signal.

According to the pass-through operation, the Enable signal is equal to 0 and the output signals a, b and c (the abc word) provided by the abc-encoder 740 are passed through as the output signals w1, w2 and w3, respectively, under a no fault condition. If a fault exists, the Enable signal is equal to 1, which will lock out the output signals a, b and c from passing the NOR gates 754, 755 and 756, and thus the output signals w1, w2 and w3 will be 0. From Table 8, above, it can be seen that the DC controller 130 will assume and maintain state 1 until the fault condition is alleviated and the Enable signal returns to 0. The abc word 0,0,0 may be referred to as the reset state.

Figure 13A:
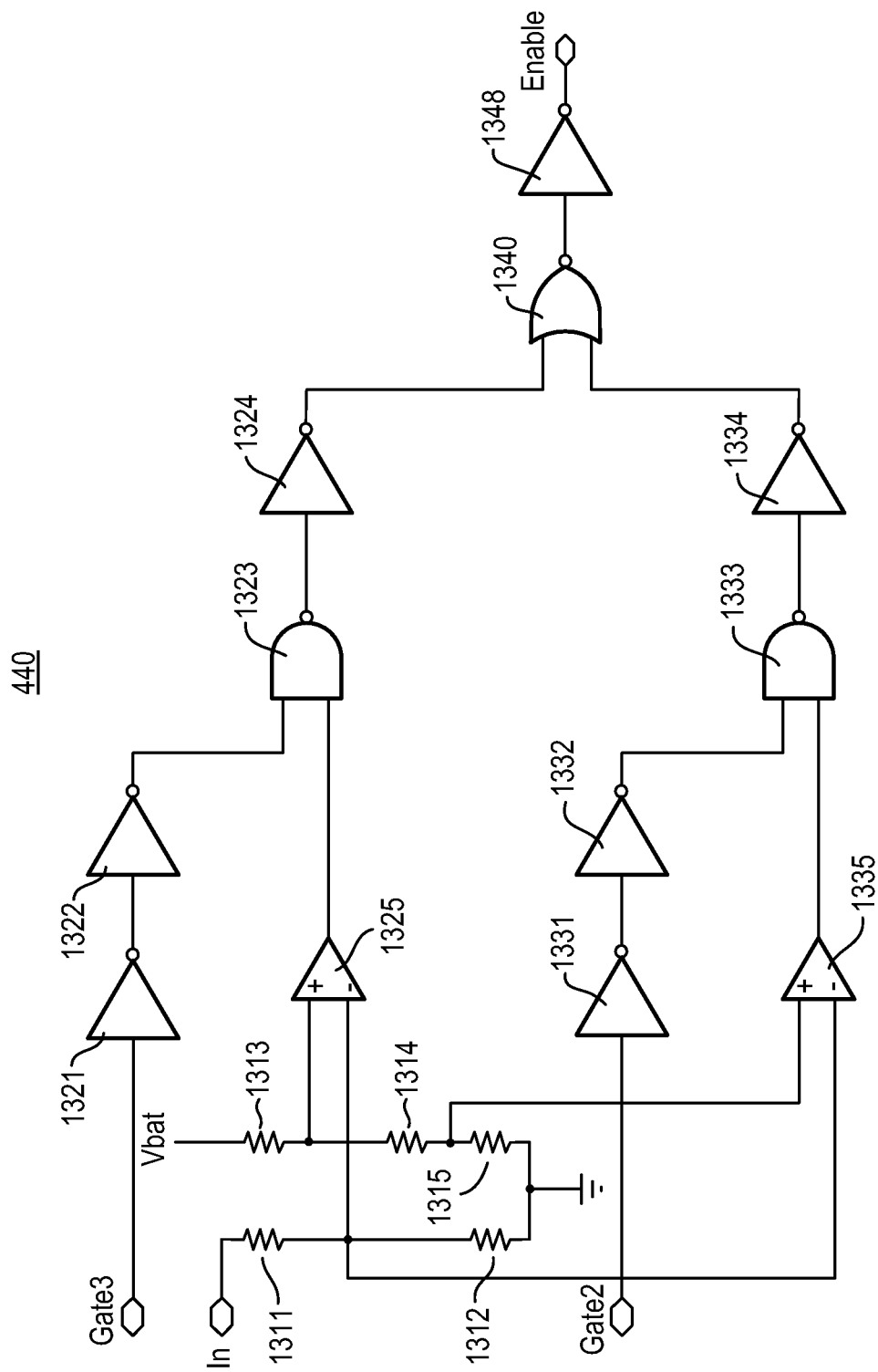
FIG. 13A is a logic circuit diagram of a fault recovery circuit of the DC controller, according to a representative embodiment.
Figure 13B:
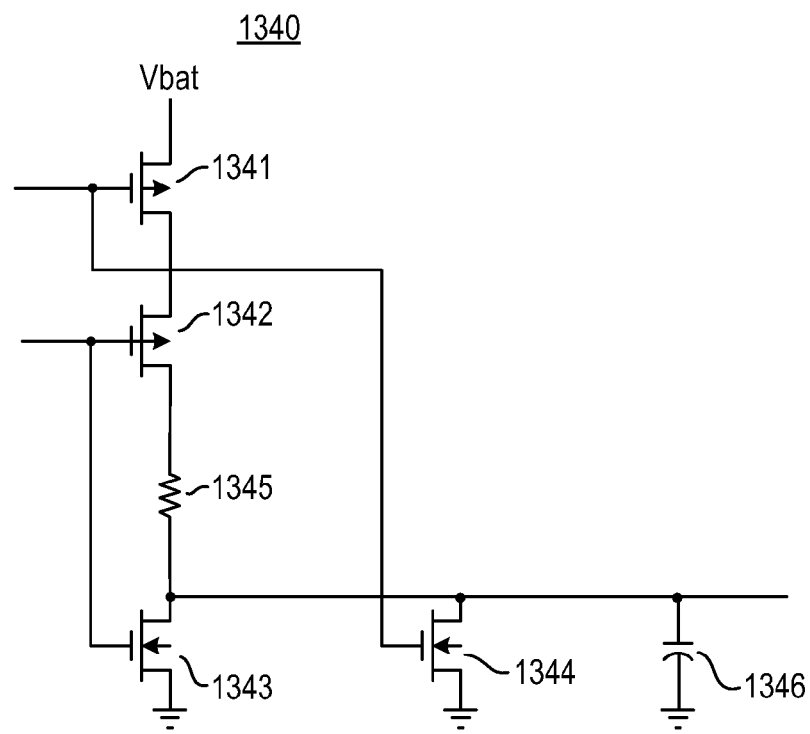
FIG. 13B is a circuit diagram of a slow rise NOR gate of the fault recovery circuit of the DC controller 130, according to a representative embodiment.
Figure 13C:
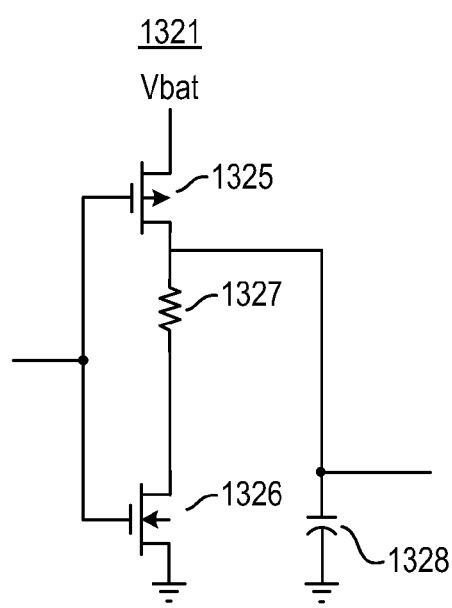
FIG. 13C is a circuit diagram of a slow fall inverter of the fault recovery circuit of the DC controller, according to a representative embodiment.

The gate signal generation operation is discussed in the context of the fault recovery operation, described below. FIG. 13A is a logic circuit diagram of the fault recovery circuit 440 of the DC controller 130, according to a representative embodiment. FIG. 13B is a circuit diagram of a slow rise NOR gate of the fault recovery circuit 440 of the DC controller 130, according to a representative embodiment. FIG. 13C is a circuit diagram of a slow fall inverter of the fault recovery circuit 440 of the DC controller 130, according to a representative embodiment.

Referring to FIG. 13A, the fault recovery circuit 440 includes inverters 1321 and 1322 connected in series for processing/buffering the Gate3 signal, and inverters 1331 and 1332 connected in series for processing/buffering the Gate2 signal. A voltage divider comprising resistors 1311 and 1312 divides the DC supply voltage Vdc appearing at the input port In into a sampled DC supply voltage. A second voltage divider comprising resistors 1313 to 1315 divides the battery voltage Vbat into first and second reference voltages, where the second reference voltage is less than the first reference voltage. A first comparator 1325 compares the sampled DC supply voltage and the first reference voltage, and a second comparator 1335 compares the sampled DC supply voltage and the second reference voltage, as discussed below.

The fault recovery circuit 440 further includes NAND gate 1323 for performing a NAND operation on the outputs of the inverter 1322 and the comparator 1325, and NAND gate 1333 for performing a NAND operation on the outputs of the inverter 1332 and the comparator 1335. Inverters 1324 and 1334 invert the outputs of the NAND gates 1323 and 1333, respectively. Slow rise NOR gate 1340 performs a NOR operation on the outputs of the inverters 1324 and 1334. An output of the slow rise NOR gate 1340 is inverted by inverter 1348, the output of which provides the Enable signal.

Generally, a fault is defined as an excessive discharge of one or both of the first and second charge storage capacitors 811 and 812 of the power switch 410. If this occurs, it results in improper operation of the DC controller 130. The remedy is to lock out the boost states for a period of time sufficient to achieve a complete recharge of the first and second charge storage capacitors 811 and 812. The fault recovery circuit 440 facilitates this remedy by detecting the fault and then asserting Enable signal equal to 1 to the w-encoder 750, as described above.

Two types of possible faults are a total charge fault and a single capacitor charge fault. A total charge fault occurs when the sum of the charges on the first charge storage capacitor 811 and the second charge storage capacitor 812 of the power switch 410 falls below a critical value, resulting in a low state 3 output voltage. This condition is detected by the comparator 1325, which compares the sampled DC supply voltage with the first reference voltage, as mentioned above. The ratio of resistor 1311 and resistor 1312 is chosen to bring the sampled DC supply voltage into the operating range of the comparator 1325. Values of the resistors 1313, 1314 and 1315 are chosen to set the first reference voltage for the comparator 1325, so that the comparator 1325 switches at a predetermined value of the DC supply voltage Vdc output by the DC controller 130 when state 3 is active. This value may be about 90 percent of normal, for instance. To ensure that the decision of the comparator 1325 passes to the Enable signal output only when state 3 is active, the Gate3 signal from the w-encoder 750 is used to enable the NAND gate 1323, such that the Gate3 signal is equal to 1 only during state 3.

It is also possible for a single capacitor charge fault to impact state 2 adversely. This occurs when one of the first and second charge storage capacitors 811 and 812 being used to produce state 2 has low charge. To detect this condition, the comparator 1335 also monitors the DC supply voltage Vdc output by the DC controller 130 via the sampled DC supply voltage by comparing the sampled DC supply voltage with the second reference voltage. The output of the comparator 1335 passes to the Enable signal output only when Gate2 is equal to 1, where the Gate2 signal is also supplied from the w-encoder 750. The Gate2 signal is 1 only when state 2 is active. Values of the resistors 1313, 1314 and 1315 are chosen also to provide the second reference voltage (lower than the first reference voltage) to the comparator 1335, so that the DC supply voltage Vdc output by the DC controller 130 in state 2 will switch the comparator 1335 when the DC supply voltage Vdc drops below a predetermined value. In this case the predetermined value may be about 90 percent of normal state 2 output voltage, for instance. To ensure that the decision of comparator 1335 passes to the Enable signal output only when state 2 is active, the Gate2 signal from the w-encoder 750 is used to enable the NAND gate 1333, such that the Gate2 signal is equal to 1 only during state 2. Again the DC controller 130 will be forced into state 1 for recharging.

When a fault is generated, the NOR gate 1340 asserts a 0 and the Enable signal is 1. Referring to FIG. 13B, the NOR gate 1340 may be constructed with resistor 1345 and capacitor 1346, so that its return to 1 is set by the time constant formed by the resistor 1345 and the capacitor 1346. The time constant is selected to be long enough to enable recharging of the first and second charge storage capacitors 811 and 812 of the power switch 410 to take place. In one example, this time is approximately 10 µsec. The NOR gate 1340 further includes transistors 1341 and 1344 gated to the output of the inverter 1324, and transistors 1342 and 1343 gated to the output of the inverter 1334. In the depicted embodiment, the transistors 1341 and 1342 are PMOS FETs and the transistors 1343 and 1344 and NMOS FETs. The resistor 1345 is connected between the source of the transistor 1342 and the drains of the transistors 1343 and 1344 (which are connected in parallel to ground). The capacitor 1346 is connected between the drain of the transistor 1344 and ground, where the drain of the transistor 1344 is the output Q of the NOR gate 1340.

In addition, as long as the Enable signal remains equal to 1, the gate signals Gate2 and Gate3 are forced to 0, as can be seen in FIG. 12, where the Enable signal is input to the NOR gates 784 and 788. This gate lockout condition is provided to ensure that fault recovery is terminated after the aforementioned time constant, and that no intervening detection of a fault condition is able to reset this time period during fault recovery.

Inverters 1321 and 1331 are of the slow fall type. Referring to FIG. 13C, which depicts an example of inverter 1321 (although the discussion applies equally to inverter 1331), the slow fall inverter provides time for the system to stabilize in state 1 before a fault condition is assessed by the fault recovery circuit 440. The inverter 1321 includes transistors 1325 and 1326, which are gated to the output of the series connected inverter 1321. In the depicted embodiment, the transistors 1325 is a PMOS FET and the transistor 1326 is an NMOS FET. The resistor 1327 is connected between the source of the transistor 1325 and the drain of the transistor 1326. The capacitor 1328 is connected to the source of the transistor 1325, and is connected to ground in parallel with the resistor 1327 and the transistor 1326. The output of the inverter 1321 is at the source of the transistor 1325.

Referring again to FIG. 12, the Gate2 signal and the Gate3 signal are created by decoding the abc word to detect the state 2 and state 3 conditions, respectively. The input a, b and c signals (bits) are used to generate ab, bb, and cb inverse bit signals by inverting the a, b and c signals through the 751, 752 and 753, respectively. It can be seen from FIG. 12 that the Gate2 and Gate3 signals observe logical equations (11) and (12), where Enableb is the logical inverse of the Enable signal:

$$Gate2=(ab*bb*c+a*b*cb)*Enableb \quad (11)$$

$$Gate3=(a*bb*c+a*b*c)*Enableb \quad (12)$$

Based on Equations (11) and (12) and Table 8, the following Table 9 truth table for the w-encoder 750 is generated:

TABLE 9

| a | b | c | Enable | w1 | w2 | w3 | gate2 | gate3 | Resultant DC Controller State |
|---|---|---|--------|----|----|----|-------|-------|-------------------------------|
| 0 | 0 | 0 | 0 | 0 | 0 | 0 | 0 | 0 | 1 |
| 0 | 0 | 1 | 0 | 0 | 0 | 1 | 1 | 0 | 2 |
| 1 | 0 | 0 | 0 | 1 | 0 | 0 | 0 | 0 | 1 |
| 1 | 0 | 1 | 0 | 1 | 0 | 1 | 0 | 1 | 3 |
| 1 | 1 | 0 | 0 | 1 | 1 | 0 | 1 | 0 | 2 |
| 1 | 1 | 1 | 0 | 1 | 1 | 1 | 0 | 1 | 3 |
| 0 | 0 | 0 | 1 | 0 | 0 | 0 | 0 | 0 | 1 |
| 0 | 0 | 1 | 1 | 0 | 0 | 0 | 0 | 0 | 1 |
| 1 | 0 | 0 | 1 | 0 | 0 | 0 | 0 | 0 | 1 |
| 1 | 0 | 1 | 1 | 0 | 0 | 0 | 0 | 0 | 1 |
| 1 | 1 | 0 | 1 | 0 | 0 | 0 | 0 | 0 | 1 |
| 1 | 1 | 1 | 1 | 0 | 0 | 0 | 0 | 0 | 1 |

Referring again to FIG. 7, the switch sequencer 420 also includes compensation decoder 770. The compensation decoder 770 is configured to decode the output signals w1, w2 and w3 output by the w-encoder 750 into first compensation signal Comp1 and second compensation signal Comp2. The first compensation signal Comp1 is used to drive a first compensation switch (e.g., compensation feedback switch 240) and the second compensation signal Comp2 is used to drive a second compensation switch (e.g., compensation feedback switch 250) of the compensation control circuit 200, discussed above. That is, the compensation feedback switch 240 is activated to an on state when the first compensation signal Comp1 is logic high, and the compensation feedback switch 250 is activated to an on state when the second compensation signal Comp2 is logic high. Table 10 is a truth table describing the desired behavior of the first and second compensation signals in the present example:

TABLE 10

| State | Comp1 | Comp2 |
|---|---|---|
| state 1 | 0 | 0 |
| state 2 | 1 | 0 |
| state 3 | 1 | 1 |

Due to causality constraints, the control logic obtains the state condition before the DC supply voltage Vdc output by the DC controller 130 settles to the corresponding voltage. It is desirable to derive the first and second compensation signals Comp1 and Comp2 from the control logic rather than from the DC supply voltage Vdc because this provides advance notice and will give the compensation feedback switches 240 and 250 time to settle in synchronicity with voltage changes applied to the output transistor 118 of the power amplifier 110. Accordingly, the compensation decoder 770 operates from the w1, w2, w3 output signal bus, as shown in FIG. 7.

Figure 14:
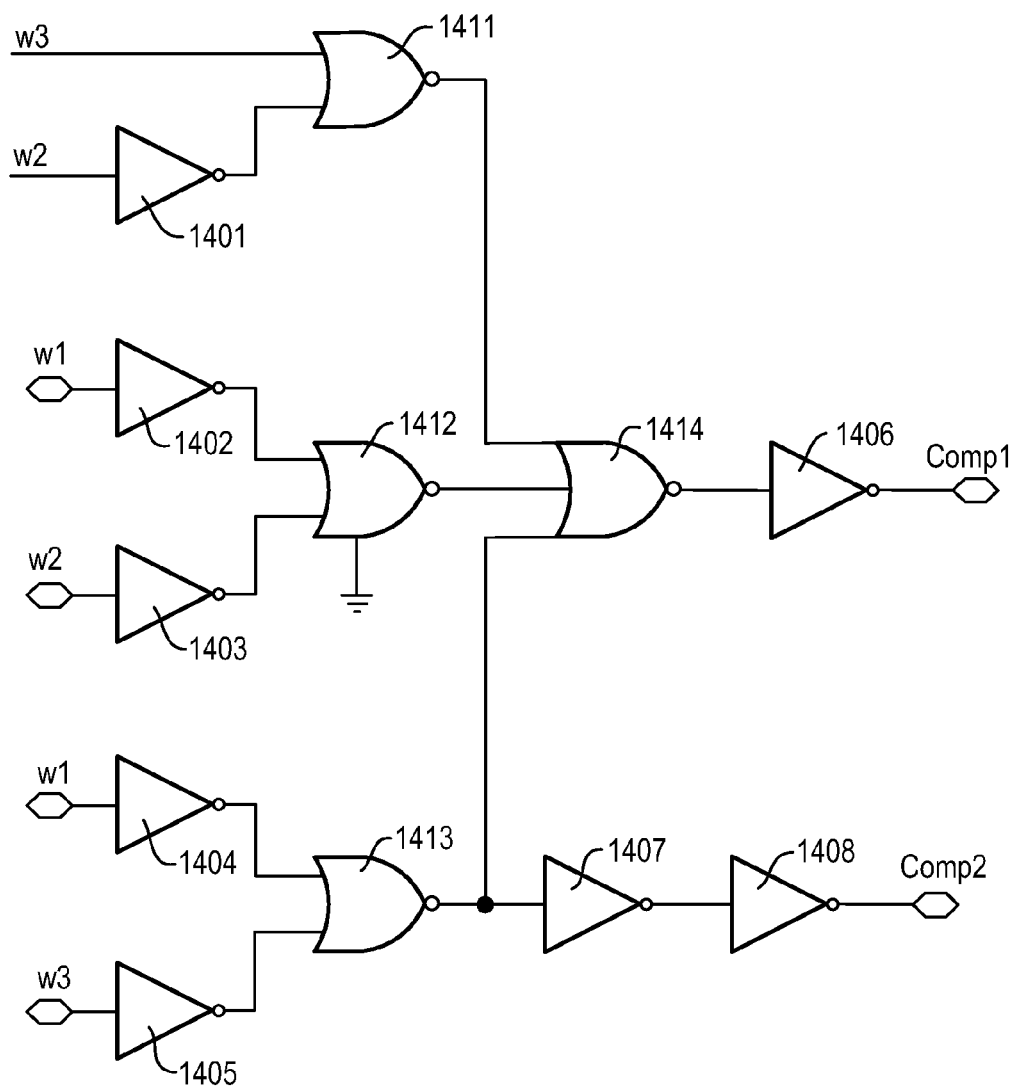
FIG. 14 is a logic circuit diagram of a compensation circuit of the switch sequencer, according to a representative embodiment.

FIG. 14 is a logic circuit diagram of the compensation decoder 770 of the switch sequencer 420, according to a representative embodiment.

Referring to FIG. 14, the compensation decoder 770 includes inverters 1401 to 1408 and NOR gates 1411 to 1414. Inverters 1402 and 1404 invert the output signal w1, inverters 1403 inverts the output signal w2, and inverters 1401 and 1405 invert the output signal w3 output by the w-encoder 750. The NOR gate 1411 performs a NOR operation on the output signal w2 and the output of the inverter 1401. The NOR gate 1412 performs a NOR operation on the outputs of the inverters 1402 and 1403. The NOR gate 1413 performs a NOR operation on the outputs of the inverters 1404 and 1405. The NOR gate 1414 performs a NOR operation on the outputs of the NOR gates 1411, 1412 and 1413. The inverter 1406 inverts the output of the NOR gate 1414 to provide the first compensation signal Comp1. The inverters 1407 and 1408 serially invert the output of the NOR gate 1413 to provide the second compensation signal Comp2.

The relationships provided by Equations (13) and (14) are observable for the compensation decoder 770:

$$Comp1 = w2b*w3 + w1*w2 + w1*w3 \quad (13)$$

$$Comp2 = w1*w3 \quad (14)$$

Referencing Table 9 above, it can be demonstrated that the relations of the first and second compensation signals Comp1 and Comp2 satisfy the desired compensation behavior summarized in Table 10.

What remains is to decode the w bus output of the w-encoder 750 into the five-bit driver bit bus that will drive the power switch 410. This operation is accomplished by the driver decoder 760.

Figure 15:
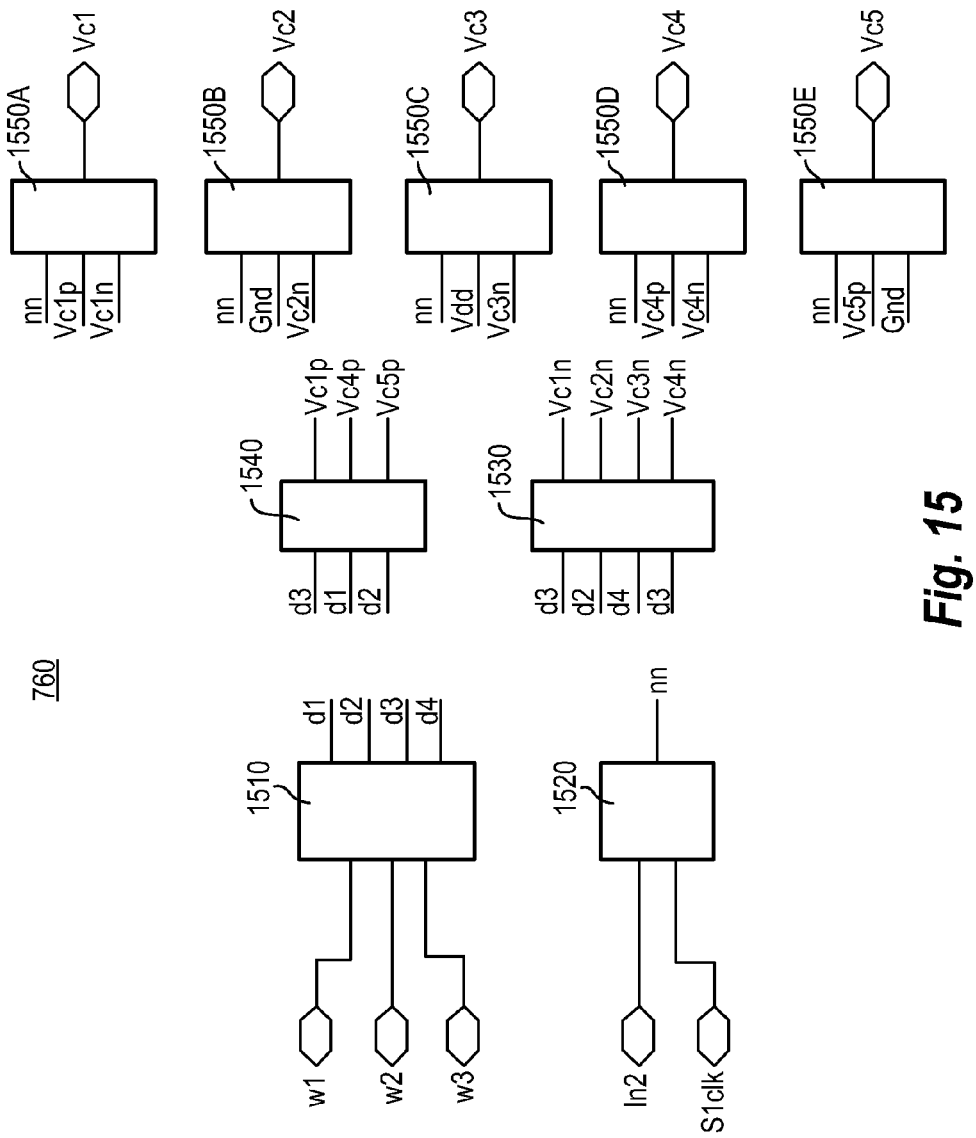
FIG. 15 is a block diagram of a driver decoder of the switch sequencer, according to a representative embodiment.

FIG. 15 is a block diagram of the driver decoder 760 of the switch sequencer 420, according to a representative embodiment. The driver decoder 760 has three separate functions. The first function is to produce the codes needed to put the power switch 410 into each of the four desired states so that the three values of the DC supply voltage Vdc are obtained. The second function is to determine which of the first and second charge storage capacitors 811 and 812 has the greatest charge, and to insure that the determined one of the first and second charge storage capacitors 811 and 812 is used in the next state 2 occurrence by adjusting the state 2 control bit word accordingly. The third function is to produce the bit changes that result in the desired control bit word in a specific order that prevents shoot through current from occurring in the power switch 410.

Referring to FIG. 15, the driver decoder 760 includes d-encoder 1510, charge manager 1520, n-sequencer 1530 and p-sequencer 1540. The d-encoder 1510 is configured to receive the output signals w1, w2 and w3 from the w-encoder 750, and to output driver bits d1, d2, d3 and d4. The charge manager 1520 is configured to receive the mid-capacitor voltage Vmcap from by the power switch 410 at input port In2 and clock signal S1clk from by the S1clk encoder 730, and to output nn signal. The p-sequencer 1540 is configured to receive the driver bits d1, d2 and d3 from the d-encoder 1510, and to output driver bits Vc1p, Vc4p and Vc5p. The n-sequencer 1530 is configured to receive the driver bits d2, d3 and d4 from the d-encoder 1510, and to output driver bits Vc1n, Vc2n, Vc3n and Vc4n. The driver decoder 760 further includes 2-to-1 multiplexers 550A to 550E which output first through fifth control bits Vc1 to Vc5, respectively. Each of the multiplexers 550A to 550E has substantially the same configurations, but receives different input signals, as discussed below.

Figure 16:
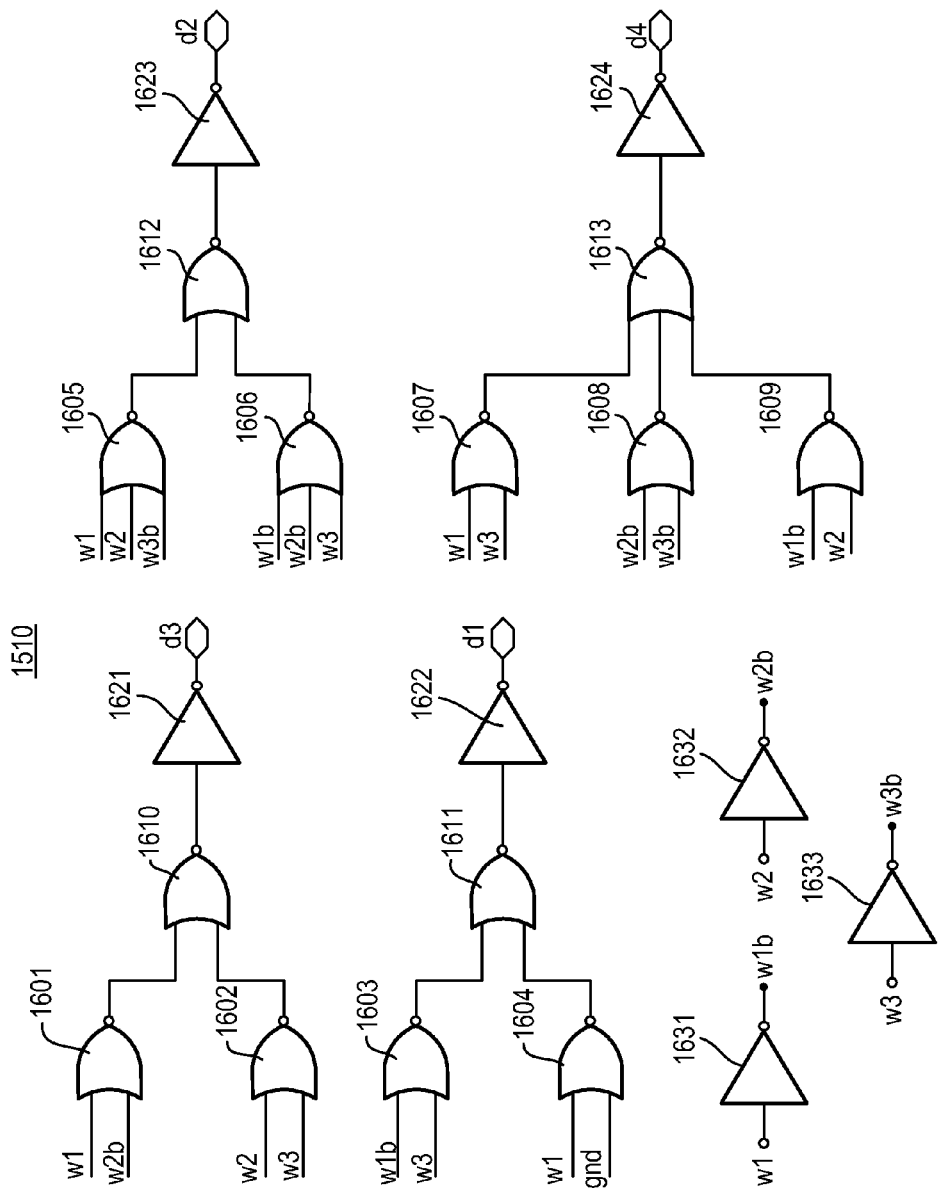
FIG. 16 is a logic circuit diagram of a d-encoder of the driver decoder, according to a representative embodiment.

FIG. 16 is a logic circuit diagram of the d-encoder 1510 of the driver decoder 760, according to a representative embodiment. The d-encoder 1510 takes the w bus (providing the output signals w1, w2 and w3) and derives from it a four-bit word comprising the driver bits d1, d2, d3 and d4, that is suitable for switching the power switch 410 into its three voltages. Notably, the output signals w1, w2 and w3 are inverted by inverters 1631, 1632 and 1633 to provide inverted output signals w1b, w2b and w3b.

The d-encoder 1510 includes NOR gates 1601 to 1613 and inverters 1621 to 1604. The NOR gate 1601 performs a NOR operation on the output signal w1 and inverted output signal w2b. The NOR gate 1602 performs a NOR operation on the output signals w2 and w3. The NOR gate 1603 performs a NOR operation on the inverted output signal w1b and output signal w3. The NOR gate 1604 performs a NOR operation on the output signal w1 and ground. The NOR gate 1605 performs a NOR operation on the output signals w1, w2 and inverted output signal w3b. The NOR gate 1606 performs a NOR operation on the inverted output signals w1b, w2b and output signal w3 signals. The NOR gate 1607 performs a NOR operation on the output signals w1 and w3. The NOR gate 1608 performs a NOR operation on the inverted output signals w2b and w3b. The NOR gate 1609 performs a NOR operation on the inverted output signal w1b and the output signal w2. The NOR gate 1610 performs a NOR operation on outputs of the NOR gates 1601 and 1602, and the inverter 1621 inverts the output of the NOR gate 1610 to provide the driver bit d3. The NOR gate 1611 performs a NOR operation on outputs of the NOR gates 1603 and 1604, and the inverter 1622 inverts the output of the NOR gate 1611 to provide the driver bit d1. The NOR gate 1612 performs a NOR operation on outputs of the NOR gates 1605 and 1606, and the inverter 1623 inverts the output of the NOR gate 1612 to provide the driver bit d2. The NOR gate 1613 performs a NOR operation on outputs of the NOR gates 1607, 1608 and 1609, and the inverter 1624 inverts the output of the NOR gate 1613 to provide the driver bit d4.

The relationships provided by Equations (15), (16), (17) and (18) hold for the d-encoder 1510:

$$d1 = w1*w3b + w1b \quad (15)$$

$$d2 = w1b*w2b*w3 + w1*w2*w3b \quad (16)$$

$$d3 = w1b*w2 + w2b*w3b \quad (17)$$

$$d4 = w1b*w3b + w2*w3 + w1*w2b \quad (18)$$

Taken together with Table 9 above, truth Table 11 is provided as follows:

TABLE 11

| w1 | w2 | w3 | d1 | d2 | d3 | d4 | State |
|----|----|----|----|----|----|----|-------|
| 0  | 0  | 0  | 1  | 0  | 1  | 1  | 1     |
| 0  | 0  | 1  | 1  | 1  | 0  | 0  | 2     |
| 1  | 0  | 0  | 1  | 0  | 1  | 1  | 1     |
| 1  | 0  | 1  | 0  | 0  | 0  | 1  | 3     |
| 1  | 1  | 0  | 1  | 1  | 0  | 0  | 2     |
| 1  | 1  | 1  | 0  | 0  | 0  | 1  | 3     |

The driver bits d1 to d4 are then passed into the n-sequencer 1530 and the p-sequencer 1540, where the same word emerges at the respective outputs of the n-sequencer 1530 and the p-sequencer 1540 after enforcement of the desired sequence, discussed below in detail. At this point, the following relations between the outputs and inputs of the n-sequencer 1530 and the p-sequencer 1540 are as follows, once the respective sequences have been enforced:

Vc1$n$=d3
Vc2$n$=d2
Vc3$n$=d4
Vc4$n$=d3
Vc5$n$=Gnd
Vc1$p$=d3
Vc2$p$=Gnd
Vc3$p$=Vbat
Vc4$p$=d1
Vc5$p$=d2

The purpose of the n and p suffixes is to separate the driver bits into those that generate state 2A and state 2B. Specifically, the n suffix bits are used to enforce state 2A and the p suffix bits enforce state 2B. As shown, some driver bits do not require sequencing and are taken from Vbat and Gnd. The two sets of driver bits are selected by the multiplexers 550A to 550E.

Figure 17:
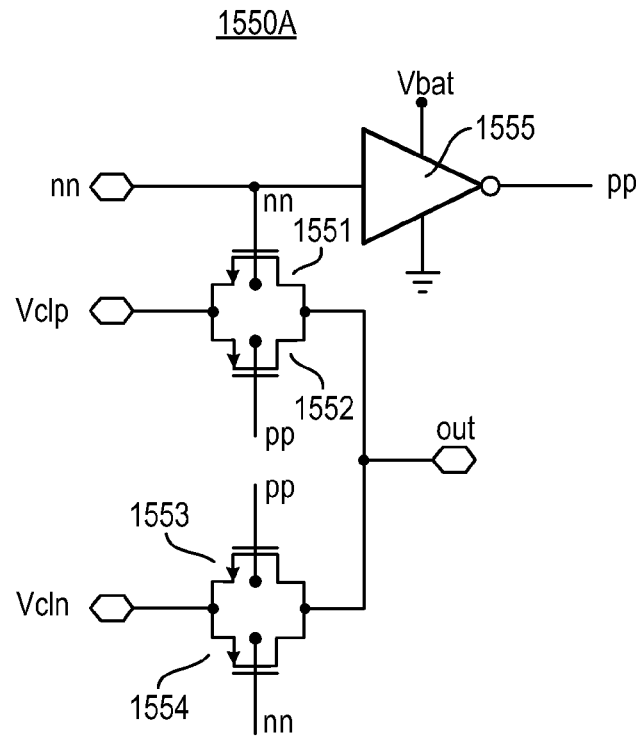
FIG. 17 is a logic circuit diagram of a multiplexer of the driver encoder, according to a representative embodiment.

FIG. 17 is a logic circuit diagram of the multiplexer 550A, according to a representative embodiment. The multiplexers 550B to 550E have substantially the same configuration of the multiplexer 550A, except for different input signals resulting in different output signals, as shown in FIG. 15.

Referring to FIG. 17, the representative multiplexer 550A is a 2-to-1 multiplexer. The multiplexer 550A includes inverter 1555, which inverts the nn signal output by the charge manager 1520 to provide pp signal. The multiplexer 550A further includes first and second sets of transistors. The first set of transistors includes transistor 1551, which is an NMOS FET gated to the nn signal, and transistor 1552, which is a PMOS FET gated to the pp signal. The second set of transistors includes transistor 1553, which is an NMOS FET gated to the pp signal, and transistor 1554, which is a PMOS FET gated to the nn signal. The sources of the transistors 1551 and 1552 are connected to the p-signal input to receive the driver bit Vc1$p$ (from the p-sequencer 1540) and the drains are connected to the output of the multiplexer 550A. The sources of the transistors 1552 and 1553 are connected to the n-signal input to receive driver bit Vc1$n$ (from the n-sequencer 1530) and the drains are connected to the output of the multiplexer 550A.

From FIG. 17, it can be seen that when the nn signal is equal to 0, the driver bit Vc1$n$ is passed to the output of the multiplexer 550A, whereas when nn signal is equal to 1, the driver bit Vc1$p$ is passed to the output of the multiplexer 550A. Generalizing, when the nn signal is equal to 0, the n-signals at the n-signal inputs are passed to the outputs of the multiplexers 550A to 550E, whereas when nn signal is equal to 1, the p-signals at the p-signal inputs are passed to the outputs of the multiplexers 550A to 550E.

Figure 18:
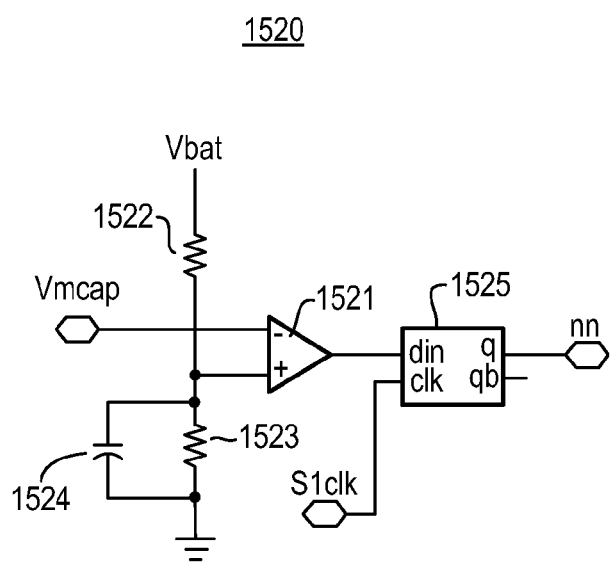
FIG. 18 is a circuit diagram of a charge manager of the driver decoder, according to a representative embodiment.

FIG. 18 is a circuit diagram of the charge manager 1520 of the driver decoder 760, according to a representative embodiment. The charge manager 1520 is used to determine which of the first and second charge storage capacitors 811 and 812 has the most charge, and to assert a 1 or 0 value for the nn signal, accordingly. The one of the first and second charge storage capacitor 811 and 812 with the most charge is used the next time state 2 is required.

Referring to FIG. 18, the charge manager 1520 includes a comparator 1521 configured to compare the mid-capacitor voltage Vmcap at the fourth node 824 (the common node of the first and second charge storage capacitors 811 and 812) in the power switch 410 to a voltage divided sampling of battery voltage Vbat. The voltage divider includes resistors 1522 and 1523, and capacitor 1524 connected in parallel with the resistor 1523. The voltage divider has a voltage gain of about 0.5. When the mid-capacitor voltage Vmcap is greater than the reference voltage supplied by the voltage divider, then the first charge storage capacitor 811 has the most charge and a value of 0 is latched by latch 1525 to the nn output as the nn signal when the clock signal S1clk has a positive edge. When the mid-capacitor voltage Vmcap is less than the reference voltage, then the second charge storage capacitor 812 has the most charge and a value of 1 is latched by the latch 1525 to the nn output as the nn signal. This determination is made when the power switch 410 is in state 1. For this reason, the clock signal S1clk is configured to have a rising edge only when the DC controller 130 enters state 1.

Figure 19:
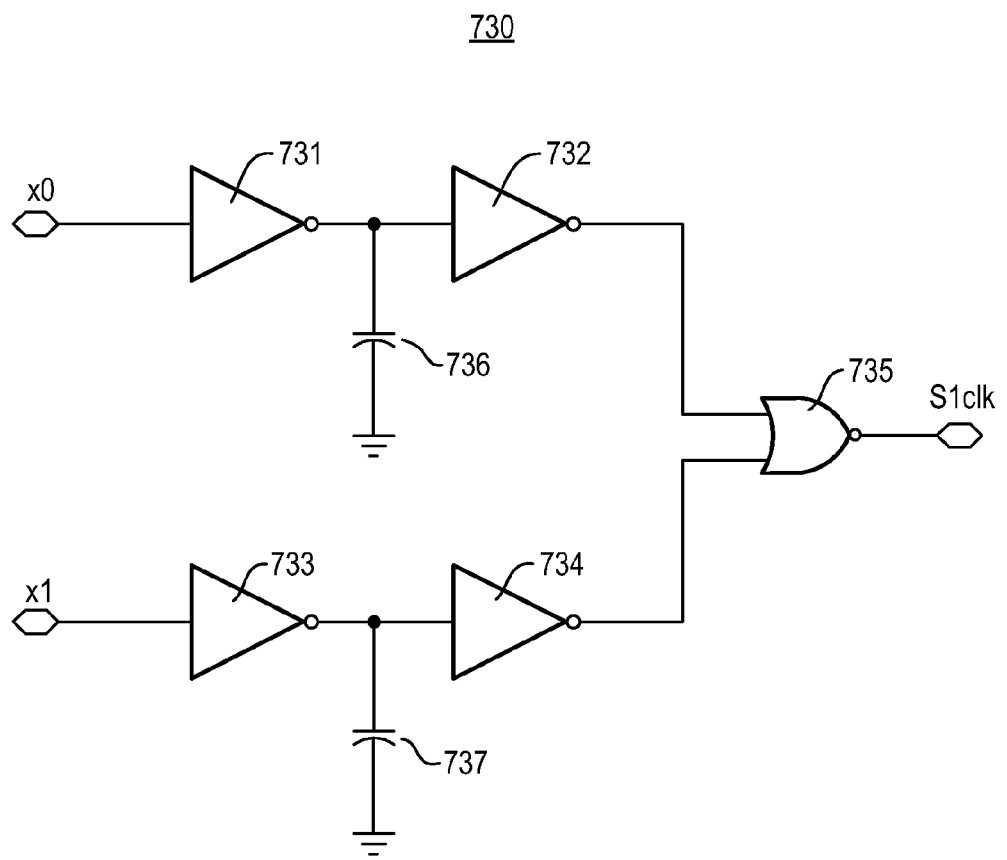
FIG. 19 is a circuit diagram of an S1clk-encoder of the switch sequencer, according to a representative embodiment.

FIG. 19 is a circuit diagram of the S1clk-encoder 730 of the switch sequencer 420, according to a representative embodiment.

Referring to FIG. 19, S1clk-encoder 730 includes inverters 731 to 734, NOR gate 735, and capacitors 736 and 737. The inverters 731 and 732 serially invert the output x0 from the x-encoder 720, and the inverters 733 and 734 serially invert the output x1 from the x-encoder 720. The NOR gate 735 performs a NOR operation on the outputs of the inverter 732 and the inverter 734 to provide the clock signal S1clk output from the S1clk-encoder 730. The capacitor 736 is connected between the output of the inverter 731 and ground, and the capacitor 737 is connected between the output of the inverter 733 and ground.

The S1clk-encoder 730 provides a clock signal S1clk having a value of 1 at its output only when x0=x1=0, which is the state 1 code for x0, x1. Thus, when the power switch 410 enters state 1, a rising edge of the clock signal S1clk will be generated, and this rising edge will latch the decision of the comparator 1521 in the charge manager 152 to the nn signal, as described above.

In view of the foregoing, truth Table 12 for the driver decoder 760 is as follows:

TABLE 12

| w1 | w2 | w3 | Q Dominant Capacitor | Vc1 | Vc2 | Vc3 | Vc4 | Vc5 | Desired State |
|----|----|----|----------------------|-----|-----|-----|-----|-----|---------------|
| 0  | 0  | 0  | 811                  | 1   | 0   | 1   | 1   | 0   | 1             |
| 0  | 0  | 0  | 812                  | 1   | 0   | 1   | 1   | 0   | 1             |
| 0  | 0  | 1  | 811                  | 0   | 0   | 1   | 1   | 1   | 2B            |
| 0  | 0  | 1  | 812                  | 0   | 1   | 0   | 0   | 0   | 2A            |
| 1  | 0  | 0  | 811                  | 1   | 0   | 1   | 1   | 0   | 1             |
| 1  | 0  | 0  | 812                  | 1   | 0   | 1   | 1   | 0   | 1             |
| 1  | 0  | 1  | 811                  | 0   | 0   | 1   | 0   | 0   | 3             |
| 1  | 0  | 1  | 812                  | 0   | 0   | 1   | 0   | 0   | 3             |

TABLE 12-continued

| w1 | w2 | w3 | Q Dominant Capacitor | Vc1 | Vc2 | Vc3 | Vc4 | Vc5 | Desired State |
|---|---|---|---|---|---|---|---|---|---|
| 1 | 1 | 0 | 811 | 0 | 0 | 1 | 1 | 1 | 2B |
| 1 | 1 | 0 | 812 | 0 | 1 | 0 | 0 | 0 | 2A |
| 1 | 1 | 1 | 811 | 0 | 0 | 1 | 0 | 0 | 3 |
| 1 | 1 | 1 | 812 | 0 | 0 | 1 | 0 | 0 | 3 |

From Table 12, it can see that the relative charge condition on the first and second charge storage capacitors 811 and 812 has the effect of switching the power switch 410 between state 2A and state 2B, and has no effect on state 1 or state 3. A comparison of Table 12 with Table 3 for the power switch 410 confirms that the states obtained by the power switch 410 are the desired states listed in Table 12.

Referring again to FIG. 15, the driver decoder 760 has two sequencers: n-sequencer 1530 and p-sequencer 1540. Together the n-sequencer 1530 and the p-sequencer 1540 force the driver bit bus (for driver bits d1 to d4) to change state in a constrained sequence that guarantees that the power switch 410 is not shorted by a transient overlap of transistor states. In other words, no transient overlap of transistor states is permitted that would act to either discharge the first or second charge storage capacitors 811 and 812 or waste energy from the power supply (battery 111). To demonstrate this, each of the four states of the power switch 410 will be observed, one at a time, from each of the possible previous states.

Figure 20:
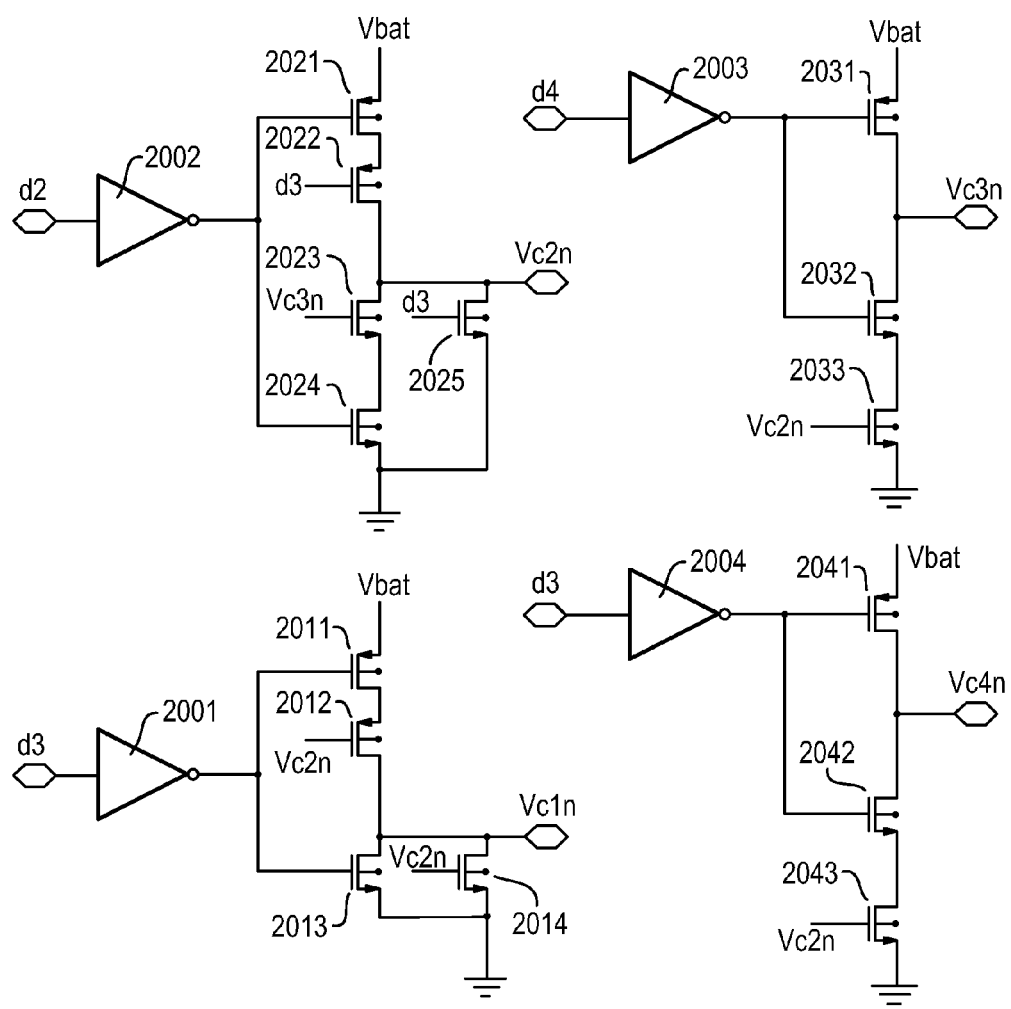
FIG. 20 is a circuit diagram of an n-sequencer of the driver decoder, according to a representative embodiment.
Figure 21:
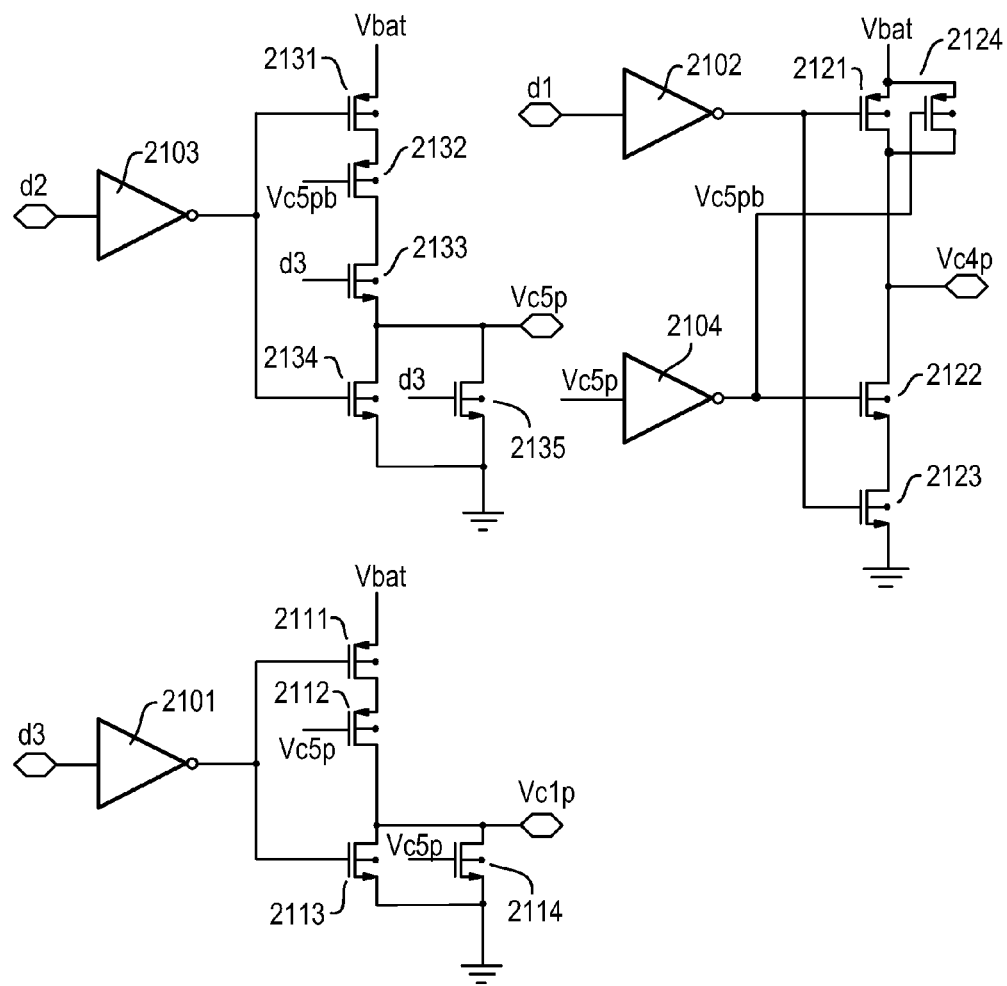
FIG. 21 is a circuit diagram of a p-sequencer of the driver decoder, according to a representative embodiment.

FIG. 20 is a circuit diagram of the n-sequencer 1530 of the driver decoder 760, according to a representative embodiment, and FIG. 21 is a circuit diagram of the p-sequencer 1540 of the driver decoder 760, according to a representative embodiment.

Referring to FIG. 20, n-sequencer 1530 includes four circuits for sequencing driver bits d3, d2, d4 and d3 into driver bits Vc1n, Vc2n, Vc3n and Vc4n, respectively. The first circuit includes inverter 2001 configured to invert the driver bit d3. The first circuit further includes transistors 2011 and 2013 gated to the output of the inventor 2001 and transistors 2012 and 2014 gated to the output of the second circuit (driver bit Vc2n). The transistors 2011 and 2012 are PMOS FETs and the transistors 2013 and 2014 are NMOS FETs, although other types of transistors may be incorporated without departing from the scope of the present teachings. The transistor 2011 includes a source connected the battery voltage Vbat and a drain connected to a source of the transistor 2012. The transistor 2012 includes a drain connected to an output for providing driver bit Vc1n. Each of the transistor 2013 and the transistor 2014 includes a drain connected to the output for providing driver bit Vc1n and a source connected to ground.

The second circuit includes inverter 2002 configured to invert the driver bit d2. The second circuit further includes transistors 2021 and 2024 gated to the output of the inventor 2002, transistors 2022 and 2025 gated to the driver bit d3, and transistor 2023 gated to the output of the third circuit (driver bit Vc3n). The transistors 2021 and 2022 are PMOS FETs and the transistors, 2023, 2024 and 2025 are NMOS FETs, although other types of transistors may be incorporated without departing from the scope of the present teachings. The transistor 2021 includes a source connected the battery voltage Vbat and a drain connected to a source of the transistor 2022. The transistor 2022 includes a drain connected to an output for providing driver bit Vc2n. The transistor 2023 includes a drain connected to the output for providing driver bit Vc2n and a source connected to a drain of the transistor 2024, which includes a source connected to ground. The transistor 2025 includes a drain connected to the output for providing driver bit Vc2n and a source connected to ground.

The third circuit includes inverter 2003 configured to invert the driver bit d4. The third circuit further includes transistors 2031 and 2032 gated to the output of the inventor 2003, and transistor 2033 gated to the output of the second circuit (driver bit Vc2n). The transistor 2031 is a PMOS FET and the transistors 2032 and 2033 are NMOS FETs, although other types of transistors may be incorporated without departing from the scope of the present teachings. The transistor 2031 includes a source connected the battery voltage Vbat and a drain connected to an output for providing driver bit Vc3n. The transistor 2032 includes a drain connected to the output for providing driver bit Vc3n and a source connected a drain of the transistor 2033. The transistor 2033 includes a source connected to ground.

The fourth circuit includes inverter 2004 configured to invert the driver bit d3. The third circuit further includes transistors 2041 and 2042 gated to the output of the inventor 2004, and transistor 2043 gated to the output of the second circuit (driver bit Vc2n). The transistor 2041 is a PMOS FET and the transistors 2042 and 2043 are NMOS FETs, although other types of transistors may be incorporated without departing from the scope of the present teachings. The transistor 2041 includes a source connected the battery voltage Vbat and a drain connected to an output for providing driver bit Vc4n. The transistor 2042 includes a drain connected to the output for providing driver bit Vc4n and a source connected a drain of the transistor 2043. The transistor 2043 includes a source connected to ground.

Referring to FIG. 21, p-sequencer 1540 includes three circuits for sequencing driver bits d3, d1 and d2 into driver bits Vc1p, Vc4p and Vc5p, respectively. The first circuit includes inverter 2101 configured to invert the driver bit d3. The first circuit further includes transistors 2111 and 2113 gated to the output of the inventor 2101 and transistors 2112 and 2114 gated to the output of the second circuit (driver bit Vc5p). The transistors 2111 and 2112 are PMOS FETs and the transistors 2113 and 2114 are NMOS FETs, although other types of transistors may be incorporated without departing from the scope of the present teachings. The transistor 2111 includes a source connected the battery voltage Vbat and a drain connected to a source of the transistor 2112. The transistor 2112 includes a drain connected to an output for providing driver bit Vc1p. Each of the transistor 2113 and the transistor 2114 includes a drain connected to the output for providing driver bit Vc1p and a source connected to ground.

The second circuit includes inverters 2102 and 2104 configured to invert the driver bit d1 and the output of the second circuit (driver bit Vc5p), respectively. The second circuit further includes transistors 2121 and 2123 gated to the output of the inventor 2102 and transistors 2122 and 2124 gated to the output of the inverter 2104. The transistors 2121 and 2124 are PMOS FETs and the transistors 2122 and 2123 are NMOS FETs, although other types of transistors may be incorporated without departing from the scope of the present teachings. Each of the transistors 2121 and 2124 includes a source connected the battery voltage Vbat and a drain connected to an output for providing driver bit Vc4p. The transistor 2122 includes a drain connected to the output for providing the driver bit Vc4p and a source connected to a drain of the transistor 2123. The transistor 2123 includes a source connected to ground.

The third circuit includes inverter 2103 configured to invert the driver bit d2. The third circuit further includes transistors 2131 and 2134 gated to the output of the inventor 2103, transistor 2132 gated to the output of the inverter 2104, and transistors 2133 and 2135 gated to the driver bit d3. The transistors 2131, 2132 and 2133 are PMOS FETs and the transistors 2134 and 2135 are NMOS FETs, although other types of transistors may be incorporated without departing from the scope of the present teachings. The transistor 2131 includes a source connected the battery voltage Vbat and a drain connected to a source of the transistor 2132. The transistor 2132 includes a drain connected to a source of the transistor 2133. The transistor 2133 includes a drain connected to an output for providing driver bit Vc5p. Each of the transistors 2134 and 2135 includes a drain connected to the output for providing the driver bit Vc5p and a source connected to ground.

The only previous states possible for state 1 are state 2A and state 2B. The case for the previous state being state 2A will be examined first. Referencing Table 12, state 2A requires control bit word 01000 and state 1 requires a control bit word of 10110. This condition corresponds to nn=0. Referencing FIG. 15, the n-sequencer output bus words that generate these two states are shown in Table 13.

TABLE 13

State 2A to State 1

| State | nn | Vc1n | Vc2n | Vc3n | Vc4n |
|---|---|---|---|---|---|
| 2A | 0 | 0 | 1 | 0 | 0 |
| 1 | 0 | 1 | 0 | 1 | 1 |

Referring to FIG. 18, it can be seen that the n-sequencer 1530 ensures that driver bit Vc4n=1 and driver bit Vc3n=1, then driver bit Vc2n=0, then driver bit Vc1n=1. This means that driver bit Vc5=0, then driver bit Vc4=1 and driver bit Vc3=1, then driver bit Vc2=0, then driver bit Vc1=1. The control bit word changes as follows, accordingly. Fifth control bit Vc5 remains 0, then fourth control bit Vc4 changes from 0 to 1 and third control bit Vc3 changes from 0 to 1, then second control bit Vc2 changes from 1 to 0, then first control bit Vc1 changes from 0 to 1. Referring to FIG. 8, this sequence and the corresponding transistor states of the power switch 410 are summarized in Table 14 below.

TABLE 14

State 2A to State 1

| Sequence | bit | Previous State | New State | Transistor | Previous State | New State |
|---|---|---|---|---|---|---|
| 1 | Vc5 | 0 | 0 | 805 | off | off |
| 2 | Vc4 | 0 | 1 | 804 | on | off |
| 2 | Vc3 | 0 | 1 | 803 | on | off |
| 3 | Vc2 | 1 | 0 | 802 | off | on |
| 4 | Vc1 | 0 | 1 | 801A-C | off | on |

Referring to the FIG. 8 and Table 14, it can be seen that transistors that are on to make state 2A are first switched off. Then state 1 is built by switching on first through fourth transistors 801A, 801B, 801C and 802. The action of switching the fourth transistor 802 on before switching on the others is incidental. The primary objective of the switch sequencer 420 has been met, in that at no time is the power switch 410 shorted by a transient overlap of transistor states.

When referring to FIGS. 20 and 21, as needed, similar analyses result in the following summary tables for the remaining possible state changes:

TABLE 15

State 2B to State 1

| State | nn | Vc1p | Vc4p | Vc5p |
|---|---|---|---|---|
| 2B | 1 | 0 | 1 | 1 |
| 1 | 1 | 1 | 1 | 0 |

TABLE 16

State 2B to State 1

| Sequence | bit | Previous State | New State | Transistor | Previous State | New State |
|---|---|---|---|---|---|---|
| 1 | Vc2 | 0 | 0 | 802 | on | on |
| 1 | Vc3 | 1 | 1 | 803 | off | off |
| 1 | Vc4 | 1 | 1 | 804 | off | off |
| 2 | Vc5 | 1 | 0 | 805 | on | off |
| 3 | Vc1 | 0 | 1 | 801A-C | off | on |

TABLE 17

State 1 to State 2A

| State | nn | Vc1n | Vc2n | Vc3n | Vc4n |
|---|---|---|---|---|---|
| 1 | 0 | 1 | 0 | 1 | 1 |
| 2A | 0 | 0 | 1 | 0 | 0 |

TABLE 18

State 1 to State 2A

| Sequence | bit | Previous State | New State | Transistor | Previous State | New State |
|---|---|---|---|---|---|---|
| 1 | Vc5 | 0 | 0 | 805 | off | off |
| 2 | Vc1 | 1 | 0 | 801A-C | on | off |
| 3 | Vc2 | 0 | 1 | 802 | on | off |
| 4 | Vc4 | 1 | 0 | 804 | off | on |
| 4 | Vc3 | 1 | 0 | 803 | off | on |

TABLE 19

State 3 to State 2A

| State | nn | Vc1n | Vc2n | Vc3n | Vc4n |
|---|---|---|---|---|---|
| 3 | 0 | 0 | 0 | 1 | 0 |
| 2A | 0 | 0 | 1 | 0 | 0 |

TABLE 20

State 3 to State 2A

| Sequence | bit | Previous State | New State | Transistor | Previous State | New State |
|---|---|---|---|---|---|---|
| 1 | Vc5 | 0 | 0 | 805 | off | off |
| 2 | Vc1 | 0 | 0 | 801A-C | off | off |
| 3 | Vc2 | 0 | 1 | 802 | on | off |
| 4 | Vc4 | 0 | 0 | 804 | on | on |
| 4 | Vc3 | 1 | 0 | 803 | off | on |

TABLE 21

State 1 to State 2B

| State | nn | Vc1p | Vc4p | Vc5p |
|---|---|---|---|---|
| 1 | 1 | 1 | 1 | 0 |
| 2B | 1 | 0 | 1 | 1 |

TABLE 22

State 1 to State 2B

| Sequence | bit | Previous State | New State | Transistor | Previous State | New State |
|---|---|---|---|---|---|---|
| 1 | Vc4 | 1 | 1 | 804 | off | off |
| 1 | Vc2 | 0 | 0 | 802 | on | on |
| 1 | Vc3 | 1 | 1 | 803 | off | off |
| 2 | Vc1 | 1 | 0 | 801A-C | on | off |
| 3 | Vc5 | 0 | 1 | 805 | off | on |

TABLE 23

State 3 to State 2B

| State | nn | Vc1p | Vc4p | Vc5p |
|---|---|---|---|---|
| 3 | 1 | 0 | 0 | 0 |
| 2B | 1 | 0 | 1 | 1 |

TABLE 24

State 3 to State 2B

| Sequence | bit | Previous State | New State | Transistor | Previous State | New State |
|---|---|---|---|---|---|---|
| 1 | Vc2 | 0 | 0 | 802 | on | on |
| 1 | Vc3 | 1 | 1 | 803 | off | off |
| 1 | Vc1 | 0 | 0 | 801A-C | off | off |
| 2 | Vc4 | 0 | 1 | 804 | on | off |
| 3 | Vc5 | 0 | 1 | 805 | off | on |

TABLE 25

State 2A to State 3

| State | nn | Vc1n | Vc2n | Vc3n | Vc4n |
|---|---|---|---|---|---|
| 2A | 0 | 0 | 1 | 0 | 0 |
| 3 | 0 | 0 | 0 | 1 | 0 |

TABLE 26

State 2A to State 3

| Sequence | bit | Previous State | New State | Transistor | Previous State | New State |
|---|---|---|---|---|---|---|
| 1 | Vc4 | 0 | 0 | 804 | on | on |
| 1 | Vc5 | 0 | 0 | 805 | off | off |
| 1 | Vc1 | 0 | 0 | 801A-C | off | off |
| 2 | Vc3 | 0 | 1 | 803 | on | off |
| 3 | Vc2 | 1 | 0 | 802 | off | on |

TABLE 27

State 2B to State 3

| State | nn | Vc1p | Vc4p | Vc5p |
|---|---|---|---|---|
| 2B | 1 | 0 | 1 | 1 |
| 3 | 1 | 0 | 0 | 0 |

TABLE 28

State 2B to State 3

| Sequence | bit | Previous State | New State | Transistor | Previous State | New State |
|---|---|---|---|---|---|---|
| 1 | Vc2 | 0 | 0 | 802 | on | on |
| 1 | Vc3 | 1 | 1 | 803 | off | off |
| 1 | Vc1 | 0 | 0 | 801A-C | off | off |
| 2 | Vc5 | 1 | 0 | 805 | on | off |
| 3 | Vc4 | 1 | 0 | 804 | off | on |

The switch sequencer 420 may perform a number of subsidiary functions, as well. For example, the switch sequencer 420 may provide state lock and startup lock functions. The state lock function includes holding each newly executed state for a minimum dwell time to ensure system stability. This is especially useful when ringing occurs on output bias and matching network in response to abrupt changes in the battery voltage Vbat. The startup lockout function includes holding the amplifier circuit 100 in the first state (e.g., no boost state NB) upon power up for a time period sufficient to allow complete charge up of the charge storage capacitors 811 and 812. In addition, as discussed above, the switch sequencer 420 may implement smart logic, which chooses which of the first or second charge storage capacitors 811 and 82 of the power switch 410 to use for intermediate voltage states based on instantaneous capacitor charge, in order to ensure symmetry of capacitor discharge.

Figure 22:
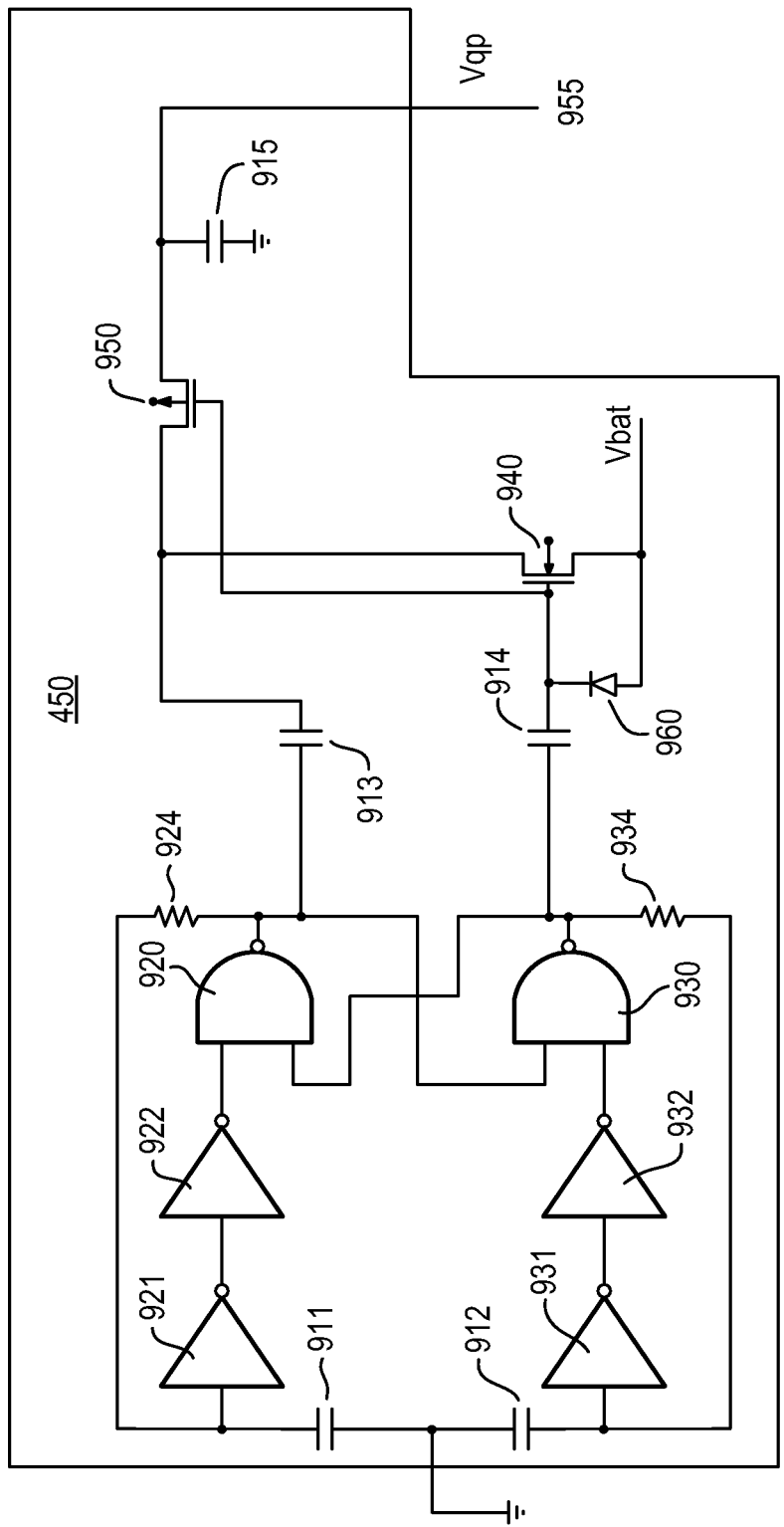
FIG. 22 is a circuit diagram of a charge pump voltage source of the DC controller, according to a representative embodiment.

FIG. 22 is a circuit diagram illustrating charge pump voltage source 450 of the DC controller 130, according to a representative embodiment. In an embodiment, the charge pump voltage source 450 provides a charge pump voltage Vqp of about 6.3V, for example.

Referring to FIG. 22, the charge pump voltage source 450 includes transistor 940 and transistor 950, which are FETs in the depicted embodiment, although other types of transistors may be incorporated without departing from the scope of the present at teachings. Transistor 940 has a drain connected to the voltage source to receive battery voltage Vbat and to an anode of diode 960, a source connected to a source of transistor 950, and a gate connected to a gate of the transistor 950 and a cathode of the diode 960. Transistor 950 has a drain connected to output port 955 for outputting the charge pump voltage Vqp. A gate of the transistor 940 is also connected to an output of NAND gate 930 through a capacitor 914, and a source of the transistor 950 is connected to an output of NAND gate 920 through a capacitor 913.

One input of NAND gate 920 is connected to representative series inverters 921 and 922, and the other input is connected to the output of NAND gate 930. Likewise, one input of NAND gate 930 is connected to representative series inverters 931 and 932, and the other input is connected to the output of NAND gate 920. The output of NAND gate 920 is also connected to the input of the corresponding first inverter 921 through resistor 924, and the output of NAND gate 930 is also connected to the input of the corresponding first inverter 931 through resistor 934. Capacitors 911 to 912 are connected between the inputs of inverters 921 and 931, respectively, and ground. The resistance values of resistors 924 and 934, as well as the values of the capacitors 911 to C915, may vary to provide unique benefits for any particular situation or to meet application specific design requirements of various implementations, as would be apparent to one skilled in the art.

As can be seen in the depicted representative embodiment, the charge pump voltage source 450 has a simple flip-flop type multi-vibrator followed by a voltage doubler, including the NAND gates 920, 930 and the corresponding inverters 921, 922 and 931, 932. NMOS transistor 940 and PMOS transistor 950 act as rectifiers with essentially zero voltage drop, hence almost 6.6V (e.g., about 6.3V), for example, can be obtained from a 3.3V supply, such as from the battery 111. Of course, alternative configurations for providing the charge pump voltage Vqp may be incorporated without departing from the scope of the present teachings.

It is understood that the values of various components of the amplifier circuit 100, including the resistance, capacitance and inductor values, may vary to provide unique benefits for any particular situation or to meet application specific design requirements of various implementations, as would be apparent to one skilled in the art. It is further understood that the types of transistors may vary, as discussed above, and that the sources/drains or the collectors/emitters of the various transistors may be reversed, without affecting the relevant functionality, depending on design factors of various embodiments.

Accordingly, the supply voltage of the output transistor 118 in the power amplifier 110 may be selectively boosted, in response to demand on the power amplifier 110. For example, a no boost voltage Vnb, which is equal to supply voltage Vdd (e.g., battery voltage Vbat), may be initially provided by the power switch 410 as the collector supply voltage. A magnitude of an envelope of the RF input signal Vin received by the power amplifier 110 is evaluated by the detector 120 (and the detector encoder 430) via the corresponding RF output signal Vout, so that it may be determined when a lowest occurring voltage extreme of the envelope becomes less than a predetermined boost threshold (e.g., a negative peak voltage level corresponding to saturation voltage of the output transistor 118). The power switch 410 then provides a medium boost voltage Vmb (e.g., 1.5Vdd) as the collector supply voltage of the output transistor 118 when the lowest occurring voltage extreme of the envelope becomes less than the predetermined threshold. The medium boost voltage Vmb includes the no boost voltage Vnb plus a first voltage boost Vb1 (e.g., 0.5Vdd) previously stored in each of the first and second charge storage capacitors 811 and 812.

The detector 120 (and the detector encoder 430) continues to evaluate the magnitude of the envelope of the RF output signal Vout, so that it may be determined when a lowest occurring voltage extreme of the envelope becomes less than the predetermined boost threshold. The power switch 410 then provides a high boost voltage Vhb (e.g., 2Vdd) as the collector supply voltage of the output transistor 118 when the lowest occurring voltage extreme of the envelope becomes less than the predetermined boost threshold. The high boost voltage Vhb includes the no boost voltage Vnb plus a second voltage boost Vb2 (e.g., Vdd) previously stored in the combined first and second charge storage capacitors 811 and 812. Also, the detector 120 (and the detector encoder 430) may determine when the lowest occurring voltage extreme of the envelope becomes greater than a predetermined recovery threshold, in response to which the power switch 410 steps down, and again provides the medium boost voltage Vmb or the no boost voltage Vnb as the collector supply voltage.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A device for controlling operation of a power amplifier configured to amplify an input signal, the device comprising:
a detector configured to detect a negative peak voltage level of an output signal of the power amplifier with respect to a predetermined boost threshold and to generate a corresponding detection signal and a reference signal; and
a controller configured to provide a supply voltage to an output transistor of the power amplifier based on a comparison of the detection signal and the reference signal, the supply voltage being a no boost voltage, which is substantially the same as a power supply voltage, when the comparison indicates that the negative peak voltage level is within the predetermined boost threshold, and the supply voltage being one of a plurality of predetermined boost voltages when the detection signal indicates that the negative peak voltage level is beyond the predetermined boost threshold,
wherein the controller generates the plurality of predetermined boost voltages by boosting the power supply voltage.

2. The device of claim 1, wherein the controller is further configured to decrease the supply voltage from the one of the plurality of predetermined boost voltages to the no boost voltage or to a boost voltage having a lower value than the one of the plurality of predetermined boost voltages when the comparison indicates that the negative peak voltage level has increased to a predetermined recovery threshold.

3. The device of claim 1, wherein the predetermined boost threshold corresponds to saturation of the output transistor.

4. The device of claim 3, wherein the detector detects the negative peak voltage level by evaluating a magnitude of an envelope of the input signal.

5. The device of claim 1, wherein the plurality of predetermined boost voltages comprise a medium boost voltage one boost voltage step above the no boost voltage and a high voltage one boost voltage step above the medium boost voltage.

6. The device of claim 5, wherein the medium boost voltage is about 1.5 times the no boost voltage and the high voltage is about twice the no boost voltage.

7. The device of claim 1, wherein controller comprises:
a detector encoder configured to perform the comparison of the detection signal and the reference signal and to output a Boost Request signal and a Recovery Request signal in response to the comparison;
a switch sequencer configured to translate the Boost Request signal and the Recovery Request signal into a plurality of control bits; and
a power switch comprising a plurality of transistors controlled by the plurality of control bits and a plurality of charge storage capacitors selectively connectable to an output of the controller by operation of the plurality of transistors for outputting the supply voltage from the controller.

8. The device of claim 7, wherein the plurality of control bits prevent each of the plurality of charge storage capacitors from being shorted by the power switch.

9. The device of claim 7, wherein the detector encoder comprises:
- a first comparator configured to compare the detection signal and the reference signal to output the Boost Request signal; and
- a second comparator configured to compare a scaled detection signal and a scaled reference signal to output the Recovery Request signal,
- wherein the scaled detection signal is based on dividing the detection signal, and the scaled reference signal is based on dividing the reference signal to provide a scaled reference signal and adding an offset voltage to the scaled reference signal.

10. The device of claim 7, wherein the controller further comprises:
- a charge pump power supply configured to provide a charge pump voltage to the power switch to charge at least one of the first and second charge storage capacitors to a voltage approximately equal to the supply voltage.

11. The device of claim 7, further comprising:
- a compensation circuit connected as shunt-shunt feedback around the output transistor of the power amplifier.

12. The device of claim 11, wherein the compensation circuit comprises a plurality of series RC circuits connected in series with a corresponding plurality of switches for selectively switching in the plurality of series RC circuits, respectively, the number of series RC circuits being less than or equal to the number of predetermined boost voltages.

13. A method of selectively boosting a collector supply voltage of an output transistor in a power amplifier amplifying a radio frequency (RF) signal, the method comprising:
- providing a supply voltage as the collector supply voltage of the output transistor by connecting a supply voltage source to the output transistor, and selectively connecting a plurality of charge storage capacitors to receive charge from the supply voltage source to charge each of the plurality of charge storage capacitors to a capacitor voltage value;
- evaluating a magnitude of an envelope of the RF signal and detecting when a lowest occurring voltage extreme of the envelope becomes less than a predetermined boost threshold;
- providing a first boosted voltage as the collector supply voltage when the lowest occurring voltage extreme of the envelope becomes less than the predetermined boost threshold by connecting one of the plurality of charge storage capacitors between the supply voltage source and the output transistor, the first boosted voltage comprising the supply voltage plus the capacitor voltage value previously stored in one of the plurality of charge storage capacitors; and
- providing a second boosted voltage as the collector supply voltage when the lowest occurring voltage extreme of the envelope becomes less than the predetermined boost threshold, while the first boosted voltage is being provided as the collector supply voltage, by simultaneously connecting two of the plurality of charge storage capacitors between the supply voltage source and the output transistor, the second boosted voltage comprising the supply voltage plus the capacitor voltage values previously stored in both of the two charge storage capacitors.

14. The method of claim 13, further comprising:
- detecting when the lowest occurring voltage extreme of the envelope becomes greater than a predetermined recovery threshold, while the second boosted voltage is being provided as the collector supply voltage; and
- providing the first boosted voltage as the collector supply voltage.

15. The method of claim 14, further comprising:
- detecting when the lowest occurring voltage extreme of the envelope again becomes greater than the predetermined recovery threshold, while the first boosted voltage is being provided as the collector supply voltage; and
- providing the supply voltage as the collector supply voltage.

16. A device for controlling operation of a power amplifier configured to amplify a radio frequency (RF) signal, the device comprising:
- a detector configured to generate a detection signal and a reference signal based on a negative peak voltage level of an output signal of the power amplifier;
- a DC controller configured to provide a DC supply voltage and a plurality of compensation signals to an output transistor of the power amplifier based on comparison of the detection signal and the reference signal, the DC supply voltage being a no boost voltage when the negative peak voltage level is above a predetermined boost threshold, and one of a medium boost voltage and a high boost voltage when the negative peak voltage level is below the predetermined boost threshold; and
- a compensation circuit comprising a plurality of series RC circuits connected in series with a corresponding plurality of switches for selectively connecting one or more of the plurality of series RC circuits, respectively, around the transistor in a shunt-shunt feedback configuration in response to the plurality of compensation signals.

17. The device of claim 16, wherein each switch of the plurality of switches comprises at least one bipolar junction transistor (BJT).

* * * * *